(12) United States Patent
Yamashita

(10) Patent No.: US 10,618,277 B2
(45) Date of Patent: *Apr. 14, 2020

(54) LIQUID JETTING APPARATUS AND WIRING MEMBER

(71) Applicant: Brother Kogyo Kabushiki Kaisha, Nagoya-shi, Aichi-ken (JP)

(72) Inventor: Toru Yamashita, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/229,386

(22) Filed: Dec. 21, 2018

(65) Prior Publication Data

US 2019/0126612 A1 May 2, 2019

Related U.S. Application Data

(63) Continuation of application No. 15/435,390, filed on Feb. 17, 2017, now Pat. No. 10,207,496.

(30) Foreign Application Priority Data

Feb. 19, 2016 (JP) .................................. 2016-029476

(51) Int. Cl.
*B41J 2/045* (2006.01)
*B41J 2/14* (2006.01)
(Continued)

(52) U.S. Cl.
CPC ....... *B41J 2/04541* (2013.01); *B41J 2/04581* (2013.01); *B41J 2/14201* (2013.01);
(Continued)

(58) Field of Classification Search
CPC ............... B41J 2/04521; B41J 2/04541; B41J 2/04546; B41J 2/04543; B41J 2/04545;
(Continued)

(56) References Cited

U.S. PATENT DOCUMENTS 8,449,094 B2    5/2013  Okubo
9,415,592 B2    8/2016  Iijima
(Continued)

FOREIGN PATENT DOCUMENTS

JP    2007-175882 A    7/2007
JP    2012-206283 A    10/2012
(Continued)

OTHER PUBLICATIONS

Jan. 28, 2020—(JP) Notice of Reasons for Refusal—App 2016-029476.

*Primary Examiner* — Kristal Feggins
(74) *Attorney, Agent, or Firm* — Banner & Witcoff, Ltd.

(57) ABSTRACT

A liquid jetting apparatus includes: a head unit including a first driving element, a second driving element, a first contact portion connected to the first driving element, and a second contact portion connected to the second driving element; and a wiring member including a flexible substrate, a first driving IC provided on the flexible substrate, a second driving IC provided on the flexible substrate, a first wire formed in the flexible substrate and connecting the first driving IC and the first contact portion, and a second wire formed in the flexible substrate and connecting the second driving IC and the second contact portion. A conductive part different from the first wire and the second wire is disposed in an area of the flexible substrate between the first driving IC and the second driving IC.

19 Claims, 18 Drawing Sheets

(51) Int. Cl.
  *H01L 23/50* (2006.01)
  *H01L 23/528* (2006.01)
  *H01L 23/538* (2006.01)
  *H01L 25/065* (2006.01)

(52) U.S. Cl.
  CPC .......... *B41J 2/14233* (2013.01); *H01L 23/50* (2013.01); *H01L 23/5286* (2013.01); *H01L 23/5386* (2013.01); *H01L 23/5387* (2013.01); *H01L 25/0655* (2013.01); *B41J 2002/14241* (2013.01); *B41J 2002/14491* (2013.01); *H01L 2924/15192* (2013.01); *H01L 2924/15323* (2013.01); *H01L 2924/19041* (2013.01); *H01L 2924/19105* (2013.01); *H01L 2924/351* (2013.01); *H01L 2924/3511* (2013.01)

(58) Field of Classification Search
  CPC ............... B41J 2/04548; B41J 2/04578; B41J 2/04576; B41J 2/04575; B41J 2/0455; B41J 2/04581; B41J 2/17546; B41J 2/14201; B41J 2/14209; B41J 2/14233; B41J 2/14274; B41J 2/14282; B41J 2/1429; B41J 2/14298; B41J 2002/14217; B41J 2002/14225; B41J 2002/14241; B41J 2002/1425; B41J 2002/14266; B41J 2002/14306; B41J 2/04586; B41J 2/04585; B41J 2/04583; B41J 2/14072
  See application file for complete search history.

(56) References Cited

U.S. PATENT DOCUMENTS 10,207,496 B2 * 2/2019 Yamashita .......... B41J 2/04541
2012/0249684 A1 10/2012 Okubo

FOREIGN PATENT DOCUMENTS

| | | |
|---|---|---|
| JP | 2013-176881 A | 9/2013 |
| JP | 2014-136310 A | 7/2014 |
| JP | 2015-120265 A | 7/2015 |

* cited by examiner

LIQUID JETTING APPARATUS AND WIRING MEMBER

CROSS REFERENCE TO RELATED APPLICATION

The present application is a continuation of U.S. patent application Ser. No. 15/435,390 filed Feb. 17, 2017, which claims priority from Japanese Patent Application No. 2016-029476 filed on Feb. 19, 2016. The disclosures of the above-noted applications are incorporated herein by reference in their entirety.

BACKGROUND

Field of the Invention

The present invention relates to a liquid jetting apparatus and a wiring member.

Description of the Related Art

As a liquid jetting apparatus, there is conventionally known an ink-jet type recording head that is mounted on a printer to jet ink onto a recording medium. This recording head includes a channel formation substrate formed with pressure chambers, piezoelectric elements corresponding to the pressure chambers, and a nozzle plate formed with nozzles communicating with the pressure chambers.

The pressure chambers of the channel formation substrate form two pressure chamber arrays arranged in a width direction of the channel formation substrate. The piezoelectric elements are arranged on a surface of the channel formation substrate while corresponding to the pressure chambers. The piezoelectric elements form two piezoelectric element arrays arranged in the width direction of the channel formation substrate while corresponding to the arrangement of the pressure chambers. The nozzle plate is stacked on a surface of the channel formation substrate on the side opposite to the piezoelectric elements.

The piezoelectric elements forming the two piezoelectric element arrays are connected to wires (lead electrodes). Each of the wires connected to the corresponding one of the piezoelectric elements is lead to an area between the two piezoelectric element arrays. The area is connected to two wiring members (COF substrates). Each of the wiring members mounts two driving ICs (drive circuits) arranged in a longitudinal direction of the channel formation substrate. When a drive signal outputted from the driving IC is supplied to each piezoelectric element via the wire, each piezoelectric element is deformed to increase ink pressure in the pressure chamber, thus jetting ink from the corresponding nozzle.

SUMMARY

In the above recording head, each of the wiring members includes two driving ICs. In that configuration, when the wiring member is handled in manufacture of the recording head, a flexible substrate of the wiring member easily bends between the two driving ICs. This makes it difficult to perform handling and positioning of each of the wiring members, thus resulting in a decrease in yield of the recording head.

An object of the present teaching is to prevent a flexible substrate from bending between two driving ICs that are mounted on a wiring member.

According to an aspect of the present teaching, there is provided a liquid jetting apparatus, including: a head unit including a first driving element, a second driving element, a first contact portion connected to the first driving element, and a second contact portion connected to the second driving element; and a wiring member including a flexible substrate, a first driving IC provided on the flexible substrate, a second driving IC provided on the flexible substrate, a first wire formed in the flexible substrate and connecting the first driving IC and the first contact portion, and a second wire formed in the flexible substrate and connecting the second driving IC and the second contact portion, wherein a conductive part different from the first wire and the second wire is disposed in an area of the flexible substrate between the first driving IC and the second driving IC.

In the liquid jetting apparatus according to the aspect of the present teaching, the conductive part, that is different from the first and second wires supplying a signal to the first and the second driving elements, is disposed in the area of the flexible substrate between the first driving IC and the second driving IC. The conductive part increases rigidity of the area of the flexible substrate, and thus the flexible substrate is not likely to bend in that area in handing of the wiring member.

DESCRIPTION OF THE EMBODIMENTS

Figure 1:
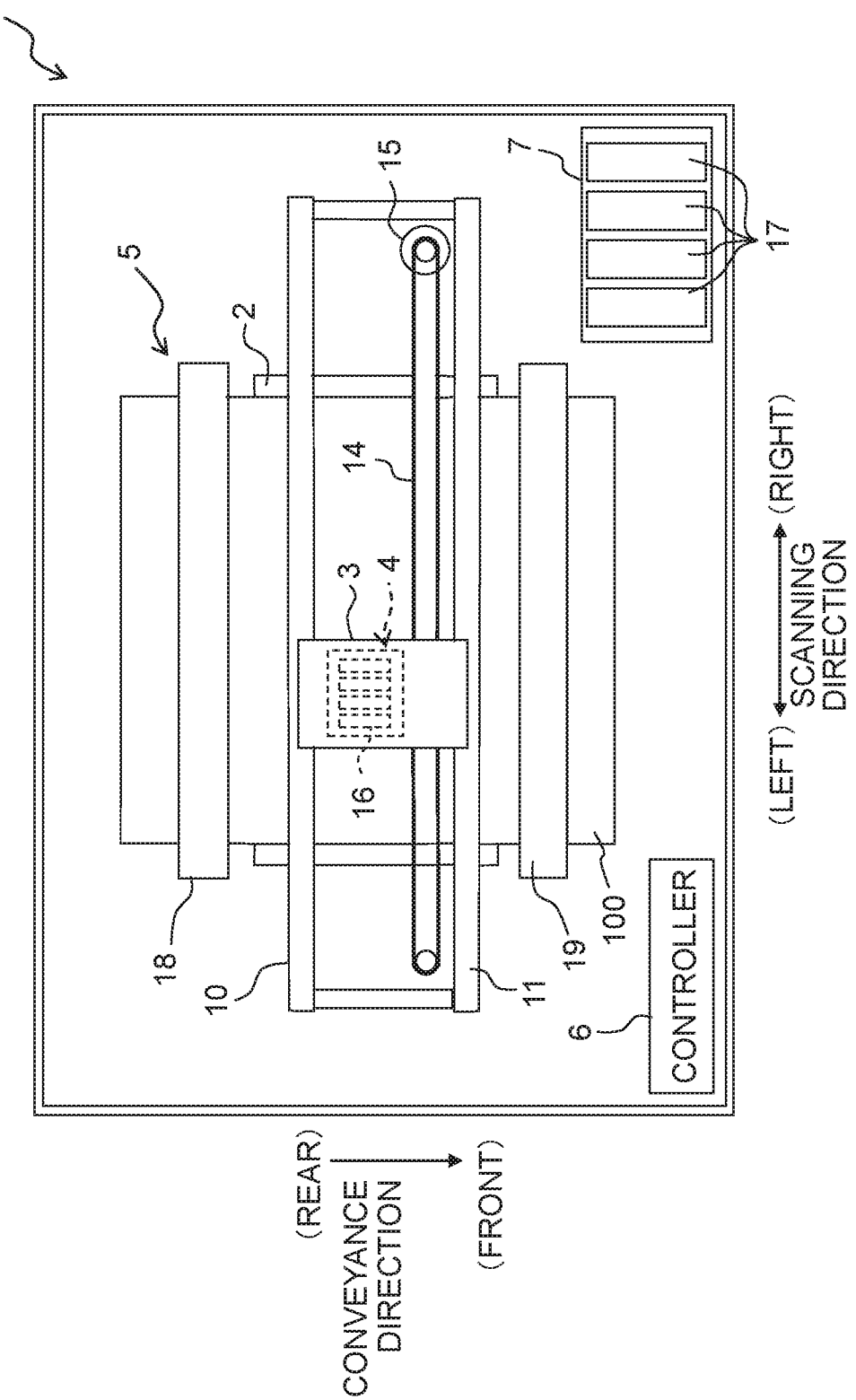
FIG. 1 is a schematic plan view of a printer according to an embodiment.

Next, an embodiment of the present teaching will be described. At first, a schematic configuration of an ink-jet printer 1 will be described with reference to FIG. 1. Note that the respective directions of front, rear, left, and right as depicted in FIG. 1 are defined as "front (frontward)", "rear (rearward)", "left (leftward)" and "right (rightward)" of the printer 1. Further, the fore side (front side) of the sheet surface of FIG. 1 is defined as "up (upward)", and the far side (the other side) of the sheet surface of FIG. 1 is defined as "down (downward)". In the following, the respective directional terms of front, rear, left, right, up and down are used as appropriate.

<Schematic Configuration of Printer>

As depicted in FIG. 1, the ink-jet printer 1 includes a platen 2, a carriage 3, an ink-jet head 4, a conveyance mechanism 5, a controller 6, and the like.

On an upper surface of the platen 2, a recording sheet 100 as a recording medium is placed. The carriage 3 is configured to reciprocate in a left-right direction (hereinafter referred to also as a scanning direction) in an area facing the platen 2 along two guide rails 10 and 11. An endless belt 14 is connected to the carriage 3, and a carriage drive motor 15 drives the endless belt 14 to move the carriage 3 in the scanning direction.

The ink-jet head 4, which is installed to the carriage 3, moves in the scanning direction together with the carriage 3. The ink-jet head 4 includes four head units 16 arranged in the scanning direction. The four head units 16 are connected, via unillustrated tubes, to a cartridge holder 7 to which ink cartridges 17 of four colors (black, yellow, cyan, and magenta) are installed. Each of the head units 16 includes nozzles 20 (see FIGS. 2 to 4) formed on a lower surface thereof (the surface on the far side of the paper surface of FIG. 1). Each of the inks supplied from the corresponding one of ink cartridges 17 is jetted from nozzles 20 of each of the head units 16 to the recording sheet 100 placed on the platen 2.

The conveyance mechanism 5 includes two conveyance rollers 18 and 19 disposed to sandwich the platen 2 in a front-rear direction. The conveyance mechanism 5 conveys the recording sheet 100 placed on the platen 2 frontward (hereinafter also referred to as a conveyance direction) by use of the two conveyance rollers 18 and 19.

The controller 6 includes a Read Only Memory (ROM), a Random Access Memory (RAM), an Application Specific Integrated Circuit (ASIC) including various control circuits, and the like. The controller 6 controls the ASIC to execute a variety of processing, such as printing on the recording sheet 100, in accordance with programs stored in the ROM. For example, in the print processing, the controller 6 controls the ink-jet head 4, the carriage drive motor 15, and the like to perform printing of an image or the like on the recording sheet 100 based on a printing command inputted from an external apparatus, such as a PC. In particular, the controller 6 alternately performs an ink jetting operation in which the ink-jet head 4 jets ink while moving in the scanning direction together with the carriage 3 and a conveyance operation in which conveyance rollers 18 and 19 convey the recording sheet 100 in the conveyance direction by a predefined amount.

<Details of Ink-Jet Head>

Subsequently, a configuration of the ink-jet head 4 will be explained in detail. Since the four head units 16 of the ink-jet head 4 have the same configuration, one of the head units 16 will be explained and the remaining head units 16 will be omitted from explanation.

Figure 2:
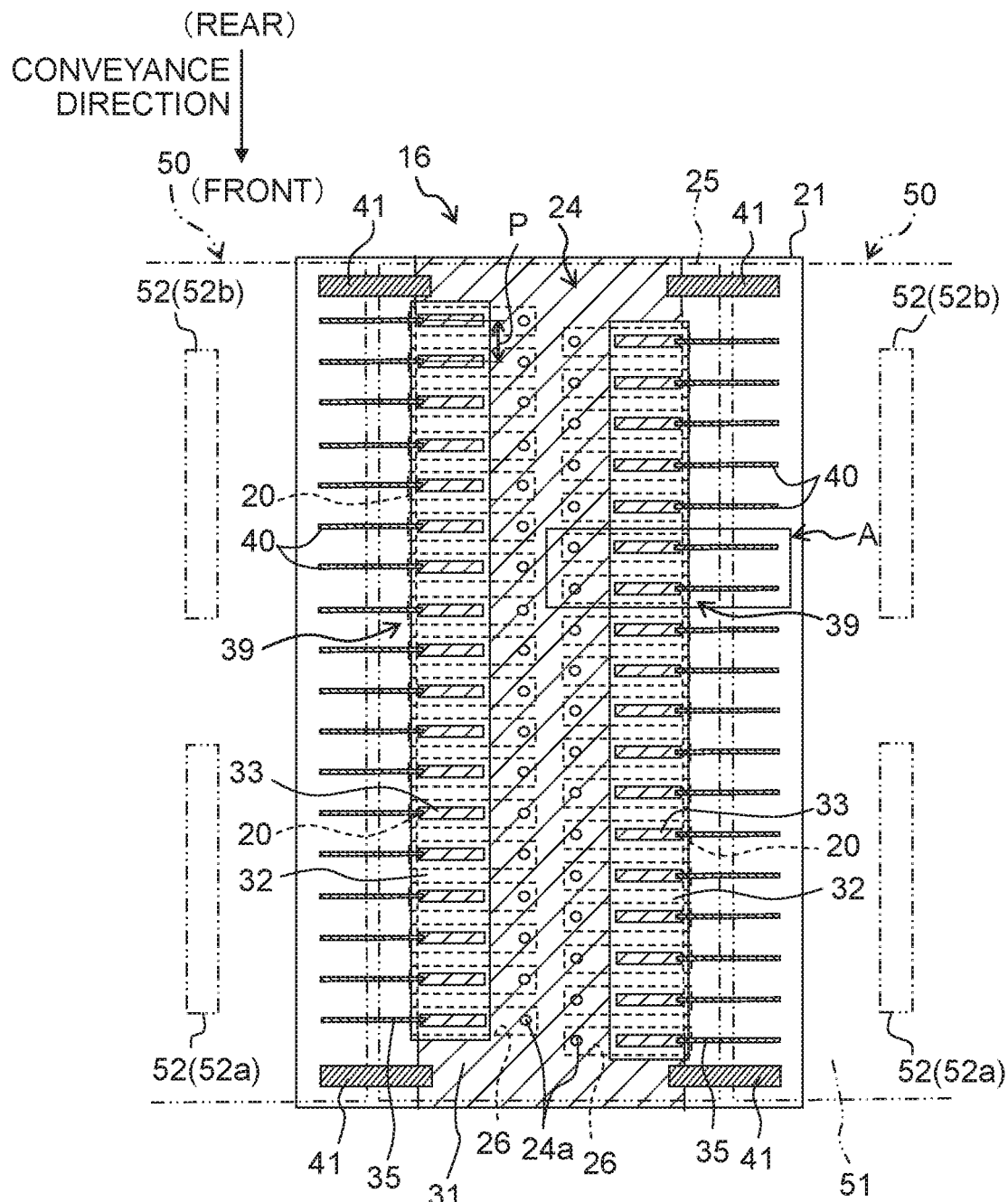
FIG. 2 is a top view of a head unit of an ink-jet head.
Figure 3:
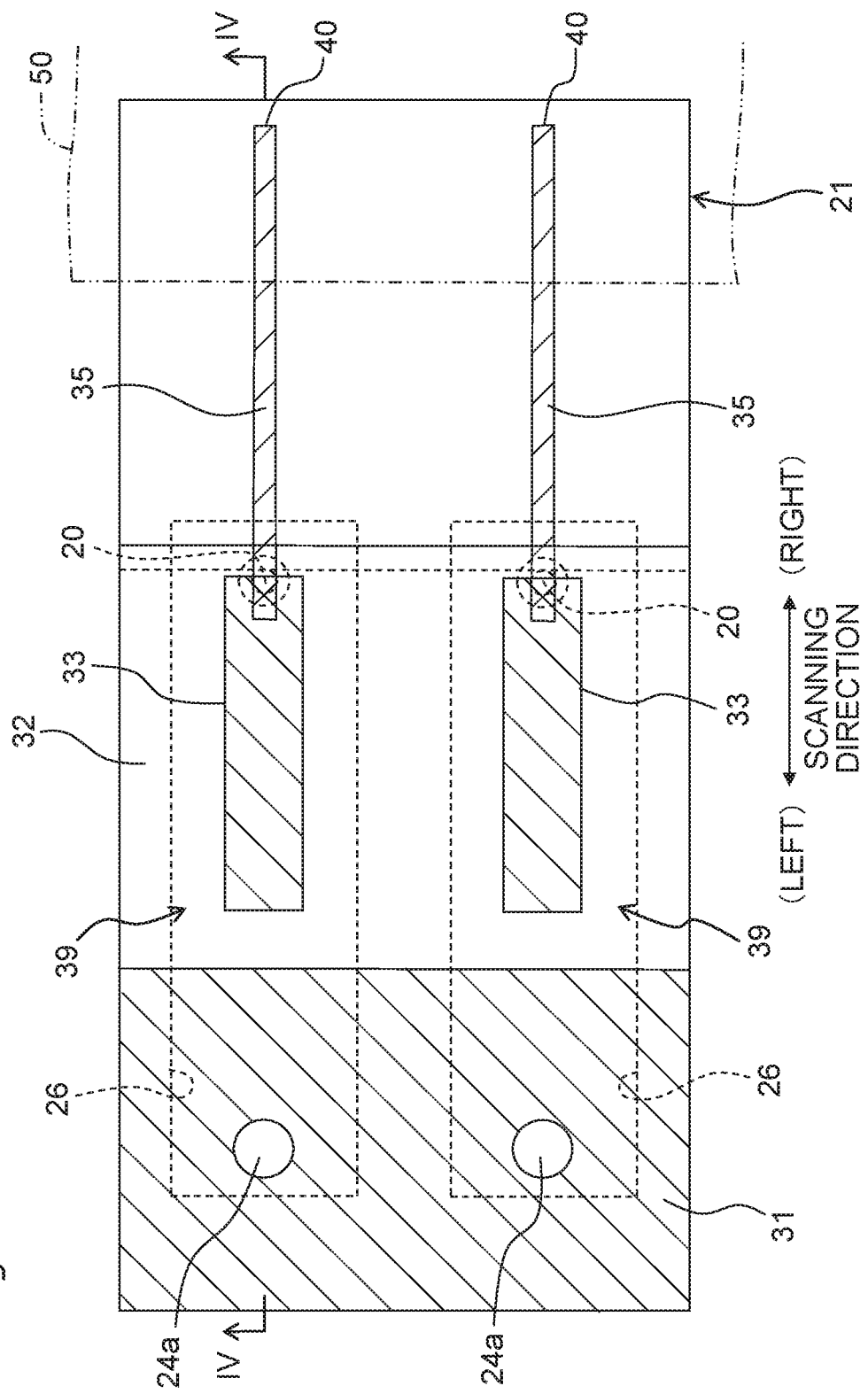
FIG. 3 is an enlarged view depicting a portion A of FIG. 2.
Figure 4:
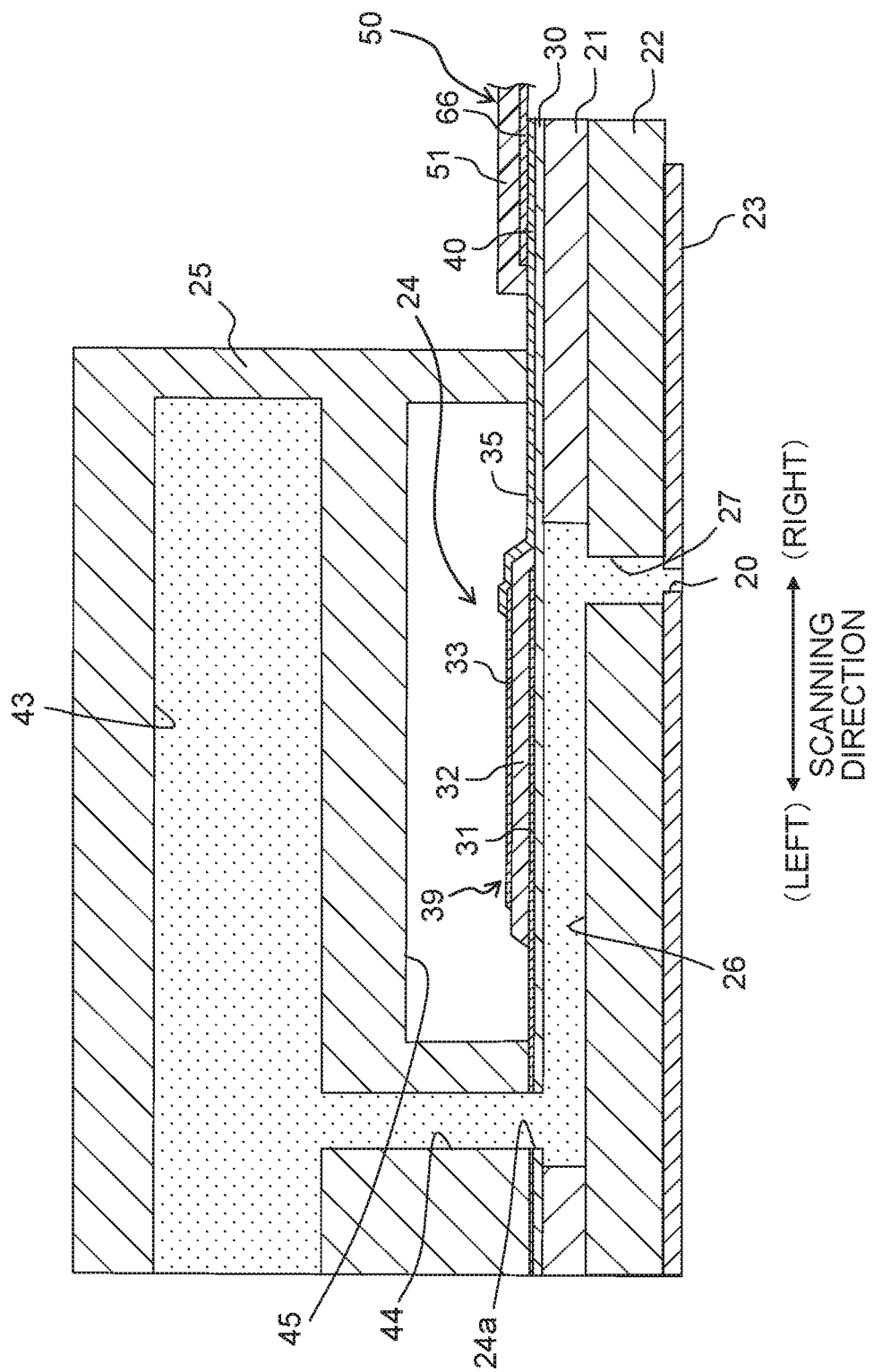
FIG. 4 is a cross-sectional view taken along a line IV-IV of FIG. 3.

As depicted in FIGS. 2 to 4, the head unit 16 includes a first channel substrate 21, a second channel substrate 22, a nozzle plate 23, a piezoelectric actuator 24, and a reservoir formation member 25. The head unit 16 is connected to two Chip On Films (COFs) 50. In FIG. 2, for the purpose of a simple illustration, the two COFs 50 and the reservoir formation member 25 disposed above the first channel substrate 21 and the piezoelectric actuator 24 are depicted by two-dot chain lines to show their external forms only. In the following, the head unit 16 and the COFs 50 joined to the head unit 16 will be described.

<First Channel Substrate>

The first channel substrate 21 is a silicon single-crystal substrate. The first channel substrate 21 is formed with pressure chambers 26. The first channel substrate 21 has a thickness of 100 μm, for example. The pressure chambers 26 are arrayed in the conveyance direction to form two pressure chamber arrays in the scanning direction. Although FIG. 2 depicts only 18 pressure chambers forming each of the two pressure chamber arrays for the purpose of a simple illustration, more pressure chambers are actually arrayed at very small pitches. The first channel substrate 21 is formed with a vibration film 30 covering the pressure chambers 26. The vibration film 30 is an insulating film including silicon dioxide ($SiO_2$) or silicon nitride ($SiN_x$) which is obtained by partially oxidizing or nitriding a surface of the silicon first channel substrate 21.

<Second Channel Substrate>

As with the first channel substrate 21, the second channel substrate 22 is a silicon single-crystal substrate. The second channel substrate 22 has a thickness of 200 μm, for example. The second channel substrate 22 is formed with channel holes 27 respectively communicating with the pressure chambers 26.

<Nozzle Plate>

The nozzle plate 23 is disposed on a lower surface of the second channel substrate 22. The nozzle plate 23 is made from a synthetic resin, such as polyimide. The nozzle plate 23 has a thickness of 30 to 50 μm, for example. The nozzle plate 23 is formed with nozzles 20 respectively communicating with the channel holes 27 of the second channel substrate 22. As depicted in FIG. 2, the nozzles 20 are arrayed similarly to the pressure chambers 26 of the first channel substrate 21 in the conveyance direction to form two nozzle arrays arranged in the scanning direction. The nozzles 20 of one of the two nozzle arrays are shifted from the nozzles 20 of the other of the two nozzle arrays in the conveyance direction by a half (P/2) of an arrangement pitch P of each nozzle array.

<Piezoelectric Actuator>

The piezoelectric actuator 24 includes the vibration film 30 and piezoelectric elements 39 that are arranged on an upper surface of the vibration film 30 while respectively corresponding to the pressure chambers 26 formed in two arrays. The vibration film 30 of the piezoelectric actuator 24 is formed with communicating holes 24a that allow channels in the reservoir formation member 25 to communicate with the pressure chambers 26, respectively.

Subsequently, a configuration of the piezoelectric element 39 will be described. A lower electrode 31 is formed on the upper surface of the vibration film 30 to extend across and above the pressure chambers 26. The lower electrode 31 is a common electrode for the piezoelectric elements 39. The lower electrode 31 may be made from any material. For example, the lower electrode 31 may be made from platinum (Pt).

Two piezoelectric bodies 32 are arranged on the lower electrode 31 while corresponding to the two pressure chamber arrays respectively. Each of the piezoelectric bodies 32 having a rectangular planer shape elongated in the conveyance direction is disposed to extend across and above the pressure chambers 26 forming the corresponding one of the pressure chamber arrays. The piezoelectric bodies 32 are made from, for example, a piezoelectric material composed primarily of lead zirconate titanate (PZT) that is a mixed crystal of lead titanate and lead zirconate. Or, the piezoelectric bodies 32 may be made from a lead-free piezoelectric material.

Upper electrodes 33 respectively corresponding to the pressure chambers 26 are formed on upper surfaces of the piezoelectric bodies 32. The upper electrodes 33 are made from, for example, platinum (Pt) or iridium (Ir).

In the above configuration, one piezoelectric element 39 is formed by one individual electrode 34, a part of the lower electrode 31 facing one pressure chamber 26, and a part of the piezoelectric body 32 facing one pressure chamber 26.

Wires 35 are connected to the upper electrodes 33 of the piezoelectric elements 39. The wires 35 are made from, for example, Aluminum (Al) or gold (Au). The wires 35 extend outward in the scanning direction from the upper electrodes 33. In particular, as depicted in FIG. 2, the wires 35 connected to the upper electrodes 33 arrayed on the left side extend leftward from the corresponding upper electrodes 33, and the wires 35 connected to the upper electrodes 33 arrayed on the right side extend rightward from the corresponding upper electrodes 33.

As depicted in FIGS. 2 to 4, drive contact portions 40 are arranged in the conveyance direction at both left and right ends of the first channel substrate 21. As depicted in FIG. 2, the wires 35 drawn from the upper electrodes 33 and extending leftward are connected to the drive contact portions 40 at the left end of the first channel substrate 21, and the wires 35 extending rightward are connected to the drive contact portions 40 at the right end of the first channel substrate 21. Ground contact portions 41, which are in electrical conduction with the lower electrode 31 as the common electrode, are arranged at both left and right ends of the first channel substrate 21.

<COF>

As depicted in FIG. 2, the two COFs 50 as the wiring members are joined to an upper surface of the first channel substrate 21 on the left and right sides in the scanning direction, respectively. A detailed configuration of the COF 50 will be explained later, and a schematic configuration thereof will be explained here. Each of the COFs 50 includes a flexible substrate 51, two driving ICs 52 (52a and 52b) mounted on the flexible substrate 51, input terminals 60, 61, and 62 connected to the controller 6 (see FIG. 1), output terminals 63 and 64 connected to the piezoelectric actuator 24, and various wires 65 to 68.

Each of the driving ICs 52 generates a drive signal to drive the piezoelectric actuator 24 based on a control signal sent from the controller 6. The drive signal is supplied to each upper electrode 33 via an output wire 66 and the wire 35 of the piezoelectric actuator 24. Potential of the upper electrode 33 supplied with the drive signal changes between a predefined drive potential and a ground potential. The ground wires 68 of the COF 50 are electrically connected to the ground contact portions 41 of the piezoelectric actuator 24. This allows the lower electrode 31 connected to the ground contact portions 41 to be constantly kept at the ground potential.

The following explanation will be made on an operation of the piezoelectric element 39 when supplied with the drive signal from the driving IC 52. Without being supplied with the drive signal, predetermined voltage is applied to each upper electrode 33. Due to the potential difference between the upper electrode 33 and the lower electrode 33, the piezoelectric body 32 deforms to project toward the pressure chamber 26. Along with the deformation of the piezoelectric body 32, the vibration film 30 deforms to project toward the pressure chamber 26. By virtue of this, the pressure chamber 26 decreases in volume. From this state, if the drive signal is supplied to any of the upper electrodes 33, the voltage applied to the upper electrode 33 is temporarily changed from the predetermined voltage to the ground voltage, and then changed to the predetermined voltage again. When the voltage is changed from the predetermined voltage to the ground voltage, the upper electrode 33 and the lower electrode 31 are at the same ground potential. Therefore, the piezoelectric body 32 recovers from the deformed state. Along with the recovery of the piezoelectric body 32 from the deformed state, the vibration film 30 is recovered from the deformed state. By virtue of this, the volume of the pressure chamber 26 is temporarily recovered from the decreased state. When the voltage is changed to the predetermined voltage again after the recovery of the vibration film 30, the piezoelectric body 32 deforms to project toward the pressure chamber 26 again. Along with the deformation of the piezoelectric body 32, the vibration film 30 deforms to project toward the pressure chamber 26 again. By virtue of this, the pressure chamber 26 decreases in volume again to produce a pressure wave inside the pressure chamber 26, thereby jetting liquid droplets of the ink from the nozzle 20 in communication with the pressure chamber 26.

<Reservoir Formation Member>

As depicted in FIG. 4, the reservoir formation member 25 is disposed across the piezoelectric actuator 24 on the far side (the upper side) of the piezoelectric actuator 24 from the first channel substrate 21, and joined to the first channel substrate 21 via the piezoelectric actuator 24. While the reservoir formation member 25 may be made from silicon, for example, as with the first and second channel substrates 21 and 22, it may also be made from other materials than silicon, such as a metallic material or a synthetic resin material.

The reservoir formation member 25 has an upper half portion formed with a reservoir 43 extending in an arrangement direction of the pressure chambers 26 (a direction perpendicular to the paper surface of FIG. 4). Through non-depicted tubes, the reservoir 43 is connected to the cartridge holder 7 (see FIG. 1) in which the ink cartridges 17 are installed.

As depicted in FIG. 4, the reservoir formation member 25 has a lower half portion formed with ink supply channels 44 extending downward from the reservoir 43. The ink supply channels 44 are in respective communication with the pressure chambers 26 of the first channel substrate 21 via the communicating holes 24a of the piezoelectric actuator 24. By virtue of this, ink is supplied from the reservoir 43 to the pressure chambers 26 via the ink supply channels 44. Further, a cover 45 is formed in the lower half portion of the reservoir formation member 25. An inner space of the cover 45 is a space in which the piezoelectric elements 39 of the piezoelectric actuator 24 are accommodated.

<Detailed Configuration of COF>

Figure 5:
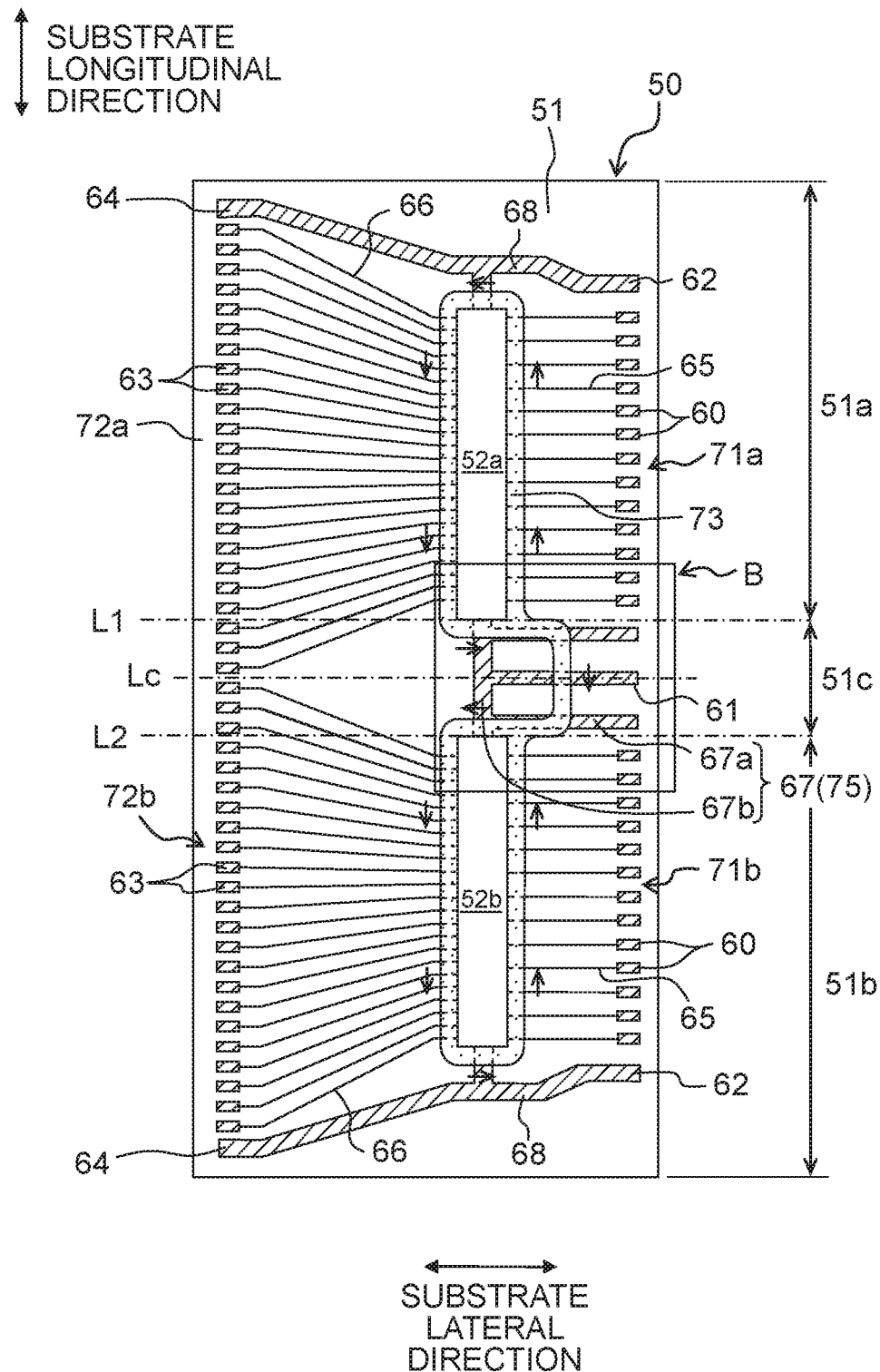
FIG. 5 depicts a back surface of a COF.
Figure 6:
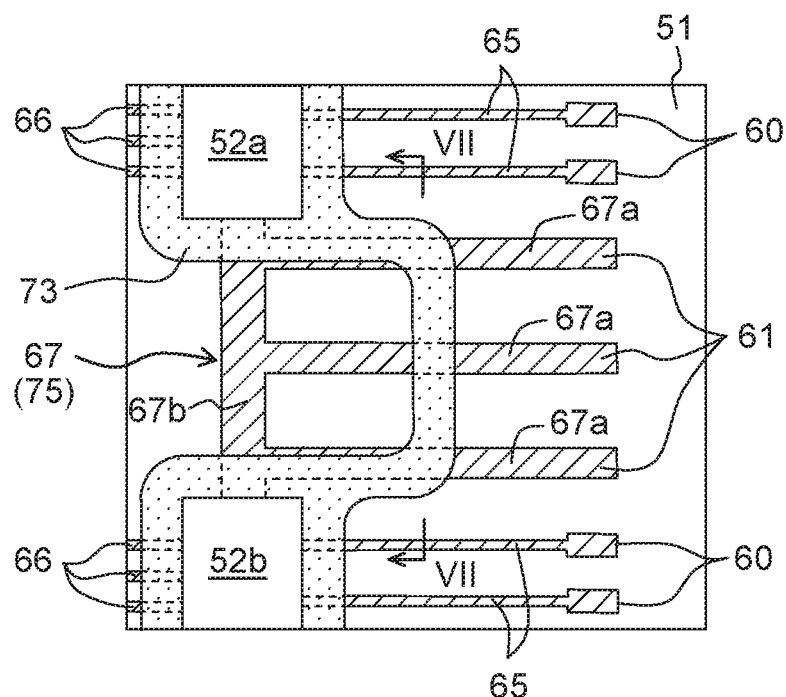
FIG. 6 is an enlarged view depicting a portion B of FIG. 5.
Figure 7:
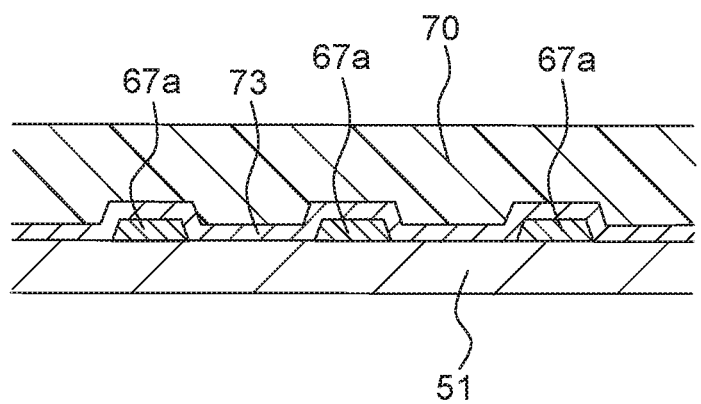
FIG. 7 is a cross-sectional view taken along a line VII-VII of FIG. 6.

Subsequently, a detailed configuration of the COF 50 will be described. For the purpose of a simple illustration, a surface (upper surface in FIG. 4) of the COF 50 at the fore side of the sheet surface of FIG. 2 is defined as a "surface", and a surface (lower surface in FIG. 4) of the COF 50 at the far side of the sheet surface of FIG. 2 is defined as a "back surface". Since two COFs 50 have the same configuration, the following explanation will be made on the COF 50 positioned on the right of FIG. 2. As depicted in FIGS. 5 to 7, the COF 50 includes the flexible substrate 51, two driving ICs 52, terminals 60 to 64, and wires 65 to 68.

The flexible substrate 51 is a film member and made from, for example, a synthetic resin, such as polyimide. The flexible substrate 51 has a rectangular planer shape. Various components or parts of the flexible substrate 51 will be explained by using wording of a longitudinal direction and a lateral direction of the flexible substrate 51 (also referred to as a substrate longitudinal direction and a substrate lateral direction).

In a center part of the flexible substrate 51 in the substrate lateral direction, two driving ICs 52 (first driving IC 52a, second driving IC 52b) are arranged in the substrate longitudinal direction. The arrangement positions of the driving ICs 52 may be described also in the following manner A back surface of the flexible substrate 51 is divided, in the substrate longitudinal direction, into a first part 51a in which the first driving IC 52a is placed, a second part 51b in which the second driving IC 52b is placed, and a third part 51c positioned between the first part 51a and the second part 51b. The first part 51a is separated from the third part 51c by a straight line L1 including an edge of the first driving IC 52a on a side of the second driving IC 52b. The second part 51b is separated from the third part 51c by a straight line L2 including an edge of the second driving IC 52b on a side of the first driving IC 52a.

The back surface of the flexible substrate 51 is formed with the terminals 60 to 64 and the wires 65 to 68 connected to the two driving ICs 52. The terminals 60 to 64 and wires 65 to 68 are formed by partially removing, through etching, a metal film formed on the entire back surface of the flexible substrate 51, such as a copper film. The terminals 60 to 64 and wires 65 to 68 are made from the same material. As described above, FIG. 2 depicts a reduced number of pressure chambers 26, piezoelectric elements 39, and drive contact portions 40 for the purpose of a simple illustration. In actual fact, however, the drive contact portions 40 forming one array in FIG. 2 correspond to the signal output terminals 63 in FIG. 5 one by one, and thus the number of drive contact portions 40 is the same as that of the signal output terminals 63.

Although illustration is omitted in FIGS. 5 and 6, as depicted in FIG. 7, the back surface of the flexible substrate 51 is covered with a protective film 70 made from an insulating material, except an area formed with the terminals 60 to 64. Namely, the wires 65 to 68 are covered with the protective film 70 and the terminals 60 to 64 are exposed from the protective film 70.

As depicted in FIG. 5, the input terminals 60, 61, and 62 arranged in the substrate longitudinal direction are formed at an end (a right end in FIG. 6) on one side of the flexible substrate 51 in the substrate lateral direction. The output terminals 63 and 64 arranged in the substrate longitudinal direction are formed at an end (a left end in FIG. 6) on the other side of the flexible substrate 51 in the substrate lateral direction.

The right end of the flexible substrate 51 depicted in FIG. 5 is connected to the controller 6 of the printer 1 (see FIG. 1). The end of the flexible substrate 51 is formed with input terminals including: signal input terminals 60 to which the control signal is inputted from the controller 6; power input terminals 61 to which the drive potential driving the piezoelectric elements 39 is supplied; and ground input terminals 62 to which the ground potential is applied. In FIG. 5, three power input terminals 61 are arranged in the center in the substrate longitudinal direction and two ground input terminals 62 are individually arranged at both sides in the substrate longitudinal direction. A terminal group 71a of the signal input terminals 60 is disposed between the power input terminals 61 and one of the ground input terminals 62 in the substrate longitudinal direction, and a terminal group 71b of the signal input terminals 60 is disposed between the power input terminals 61 and the other of the ground input terminals 62 in the substrate longitudinal direction. The signal input terminals 60 forming the terminal group 71a are connected to the first driving IC 52a via the input wires 65. The signal input terminals 60 forming the terminal group 71b are connected to the second driving IC 52b via the input wires 65.

The three power input terminals 61 are connected to the driving ICs 52 via a power wire 67 arranged in the third part 51c of the flexible substrate 51. The power wire 67 includes three wires 67a and a connection part 67b. The three wires 67a, which extend from the three power input terminals 61 in the substrate lateral direction, are arranged at intervals in the substrate longitudinal direction. The connection part 67b, which extends between the two driving ICs 52 in the substrate longitudinal direction, is connected to the two driving ICs 52. The connection part 67b connects the three wires 67a. The connection part 67b continuously extends from the first part 51a of the flexible substrate 51 in which the first driving IC 52a is disposed to the second part 51b of the flexible substrate 51 in which the second driving IC 52b is disposed. Both ends of the connection part 67b are connected to the two driving ICs 52, respectively.

In other words, the connection part 67b extends from the first driving IC 52a to the second driving IC 52b across the third part 51c of the flexible substrate 51 in a direction intersecting with an intermediate line Lc between the two driving ICs 52. The "intermediate line Lc between the two driving ICs 52" is a line connecting points equidistant from the two driving ICs 52. As depicted in FIG. 6, the wires 67a and the connection part 67b forming the power wire 67 are thicker than the input wires 65 and output wires 66.

The two ground input terminals 62 are respectively connected to the two driving ICs 52 via the two ground wires 68 disposed at the outsides of the two driving ICs 52 in the substrate longitudinal direction.

The left end of the flexible substrate 51 in FIG. 5 is joined to the right-side upper surface of the first channel substrate 21 in FIG. 2. The left end of the flexible substrate 51 is formed with signal output terminals 63 and two ground output terminals 64. In FIG. 5, the two ground output terminals 64 are arranged at both end sides in the substrate longitudinal direction. Two terminal groups 72a and 72b of the signal output terminals 63 are arranged between the two ground terminals 64.

The two ground output terminals 64 are connected to the two driving ICs 52 via the two ground wires 68, respectively. Namely, the ground wires 68 not only function to supply the ground potential to the driving ICs 52 but also function to supply the ground potential to the ground output terminals 64. The signal output terminals 63 forming the terminal group 72a are connected to the first driving IC 52a via the output wires 66. The signal output terminals 63 forming the terminal group 72b are connected to the second driving IC 52b via the output wires 66. The output wires 66 are arranged radially from each of the driving ICs 52 to the signal output terminals 63.

When the left end of the flexible substrate 51 in FIG. 5 is joined to the first channel substrate 21, the two ground output terminals 64 are connected to the two ground contact portions 41 of FIG. 2, respectively. The signal output terminals 63 of the terminal group 72a are connected to the drive contact portions 40 on the front side of FIG. 2, and the signal output terminals 63 of the terminal group 72b are connected to the drive contact portions 40 on the rear side of FIG. 2. Namely, the first driving IC 52a outputs the drive signal to a group of the piezoelectric elements 39 on the front side of FIG. 2 via the terminal group 72a. The second driving IC 52b outputs the drive signal to a group of the piezoelectric elements 39 on the rear side of FIG. 2 via the terminal group 72b.

As depicted in FIG. 5, a sealing material 73 made from a curing resin surrounds the entire outer circumference of each of the two driving ICs 52. The sealing material 73, which is generally called underfill, seals joining portions between the driving ICs 52 and the flexible substrate 51, for the purpose of preventing moisture and the like from permeating through their gaps. As depicted in FIGS. 6 and 7, the sealing material 73 is provided not only around the outer circumferences of the two driving ICs 52 but also in the third part 51c of the flexible substrate 51. The sealing material 73 in the third part 51c extends in the substrate longitudinal direction that is the arrangement direction of the two driving ICs 52 to connect to the sealed parts of the two driving ICs 52. As depicted in FIG. 7, the protective film 70 is disposed on the sealing material 73 extending across the wires 67a. In FIG. 5, the sealing material 73 may be formed around the two driving ICs 52 and in the third part 51c in a traversable manner by introducing the sealing material 73 while following arrows of FIG. 5.

The flexible substrate 51 of the COF 50 bends easily, and thus required to be handled carefully. In the present embodiment, such a flexible substrate 51 mounts the two driving ICs 52. In that configuration, in a case of handing the COF 50, the third part 51c of the flexible substrate 51 between the first part 51a having the first driving IC 52a and the second part 51b having the second driving IC 52b bends easily.

When joined to the head unit 16, the flexible substrate 51 is conveyed and positioned by being sucked and held by a suction apparatus (not depicted). On that occasion, when the third part 51c of the flexible substrate 51 is bent, suction of the flexible substrate 51 will fail. Or, when the flexible substrate 51 is bent, positioning at the time of joining will be difficult. This decreases a production yield of the head unit 16.

In the present embodiment, however, the power wire 67 is disposed in the third part 51c of the flexible substrate 51. The power wire 67 is different from the input wires 65 and output wires 66 for signal transmission, and the power wire 67 disposed in the third part 51c functions as a conductive part 75 reinforcing the third part 51c positioned between the two driving ICs 52. The conductive part 75 enhances rigidity of the third part 51c, which prevents the third part 51c of the flexible substrate 51 from bending during handling of the COF 50.

In the present embodiment, the conductive part 75 for substrate reinforcement disposed in the third part 51c of the flexible substrate 51 is the power wire 67 supplying power-supply voltage to the driving ICs 52. Namely, the power wire 67 that is required to drive the driving ICs 52 and disposed in the third part 51c strengthens the flexible substrate 51. The power wire 67 functioning as the conductive part 75 is made from the same material as other wires of the COF 50, such as the input wires 65 and output wires 66. Thus, the conductive part 75 for substrate reinforcement and other wires may be formed during the same etching step at a time.

The connection part 67b of the power wire 67 extends across the third part 51c of the flexible substrate 51 in the direction intersecting with the intermediate line Lc of the two driving ICs 52 from the first driving IC 52a to the second driving IC 52b. The connection part 67b continuously extends from the first part 51a to the second part 51b. In such a configuration, reinforcement effect of the power wire 67 increases, which prevents the third part 51c from bending.

The power wire 67 disposed in the third part 51c is preferably thick to strengthen the flexible substrate 51. However, if the power wire 67 is too thick, a wire width and wire pitch may greatly vary between the area formed with the power wire 67 and the adjacent areas formed with other wires.

In the present embodiment, various wires are formed at a time by forming a metal layer on the back surface of the flexible substrate 51 and etching the metal layer, as described above. On that occasion, if the power wire 67 having a great thickness is formed in the vicinity of the areas formed with the input wires 65 and output wires 66 required to be etched with a high degree of accuracy, flow velocity of an etching liquid greatly differs between the areas formed with high-accurate wires and the area formed with the thick wire. This reduces etching accuracy in parts, of the input wires 65 and output wires 66, close to the power wire 67. In the present embodiment, however, the power wire 67 is not a single thick wire, but formed to include wires 67a between the two driving ICs 52. This reduces the difference in wire width and wire pitch between the areas formed with the input wires 65 and output wires 66 and the area formed with the power wire 67, thus preventing decrease in etching accuracy in formation of the input wires 65 and output wires 66.

In the present embodiment, the third part 51c is formed with the sealing material 73 sealing the joining portions between the driving ICs 52 and the flexible substrate 51. Thus, the third part 51c is strengthened further by the sealing material 73, thus enhancing rigidity of the third part 51c.

In the above embodiment, the ink-jet head 4 corresponds to "a liquid jetting apparatus" of the present teaching. The piezoelectric element 39 and drive contact portion 40 connected to the first driving IC 52a respectively correspond to "a first driving element" and "a first contact portion" of the present teaching. The piezoelectric element 39 and drive contact portion 40 connected to the second driving IC 52b respectively correspond to "a second driving element" and "a second contact portion" of the present teaching.

The COF 50 corresponds to "a wiring member" of the present teaching. The output wire 66 connected to the first driving IC 52a corresponds to "a first wire" of the present teaching. The output wire 66 connected to the second driving IC 52b corresponds to "a second wire" of the present teaching. The power input terminal 61 corresponds to "a first constant-potential terminal" of the present teaching. The power wire 67 corresponds to "a first constant-potential wire" of the present teaching.

Subsequently, modified embodiments in which various modifications are added to the above embodiment will be described. The components or parts which are the same as those of the above embodiment are designated by the same reference numerals, and any explanation therefor will be omitted as appropriate.

First Modified Embodiment

Figure 8:
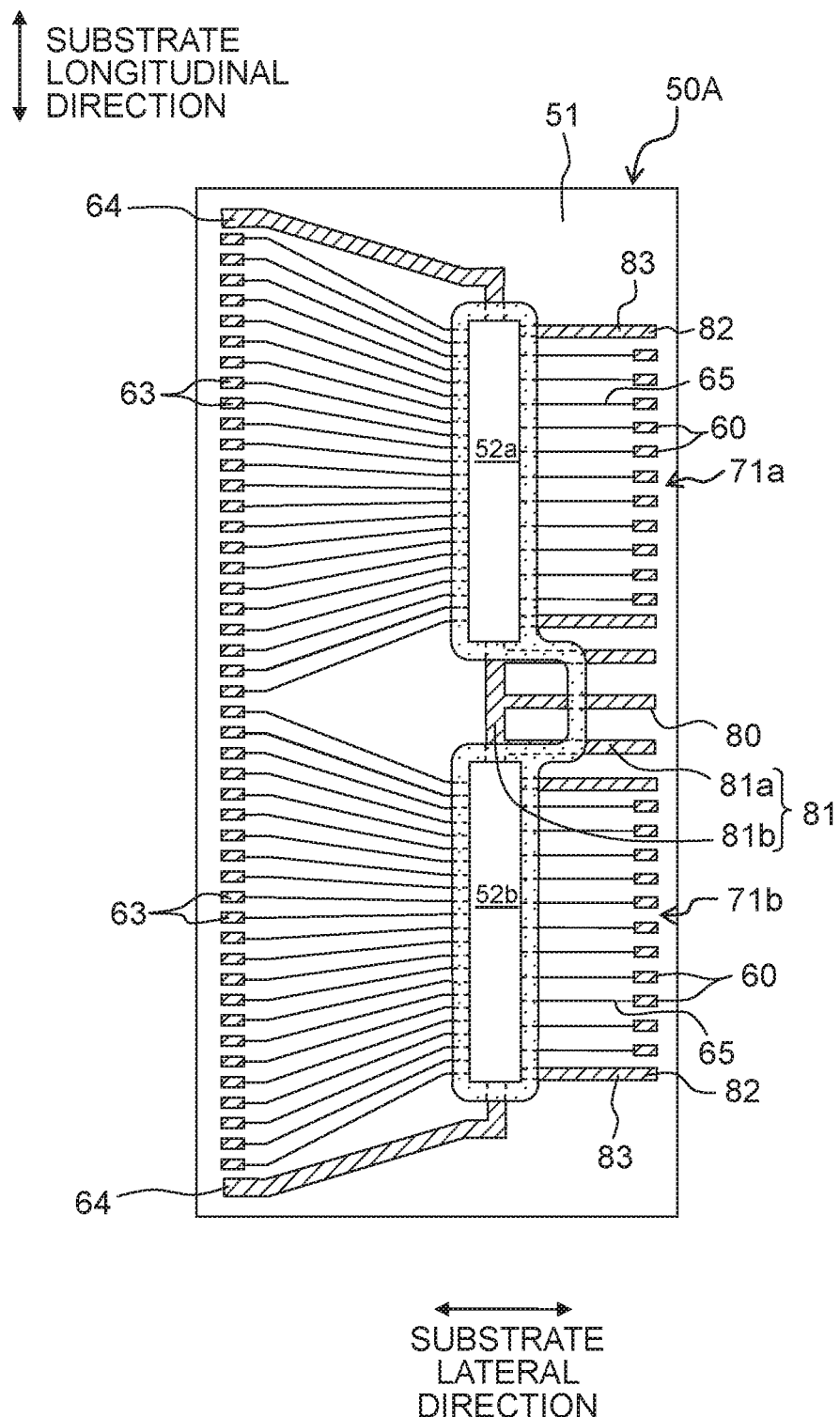
FIG. 8 depicts a back surface of a COF according to a first modified embodiment.

In the above embodiment, the power wire 67 is disposed in the third part 51c of the flexible substrate 51. The ground wires 68, however, may be disposed in the third part 51c to form a conductive part reinforcing the third part 51c. In a COF 50A depicted in FIG. 8, three ground input terminals 80 are arranged between the terminal group 71a and the terminal group 71b of the signal input terminals 60. The three ground input terminals 80 are connected to three wires 81a of ground wire 81, and the three wires 81a are connected to a connection part 81b connecting the two driving ICs 52. In the first modified embodiment, two power input terminals 82 are arranged at outsides of the terminal groups 71a and 71b of the signal input terminals 60 in the substrate longitudinal direction, and two power wires 83 are arranged in the first part 51a and second part 51b of the flexible substrate 51, respectively.

Second Modified Embodiment

Figure 9:
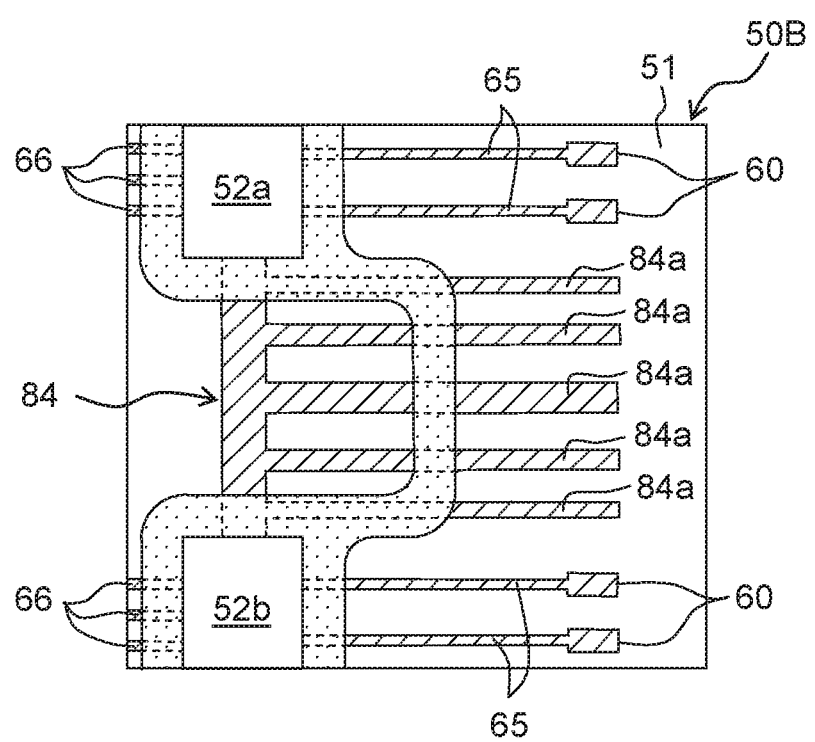
FIG. 9 is a partial enlarged view of a COF according to a second modified embodiment.

The wires forming the conductive part may differ in width. For example, in a COF 50B depicted in FIG. 9, widths of five wires 84a of a power wire 84 are narrower toward the input wires 65. Such a configuration reduces the difference in wire intervals between the input wires 65 and the wires 84a adjacent thereto, thus preventing deterioration in etching accuracy of the input wires 65.

Third Modified Embodiment

Figure 10:
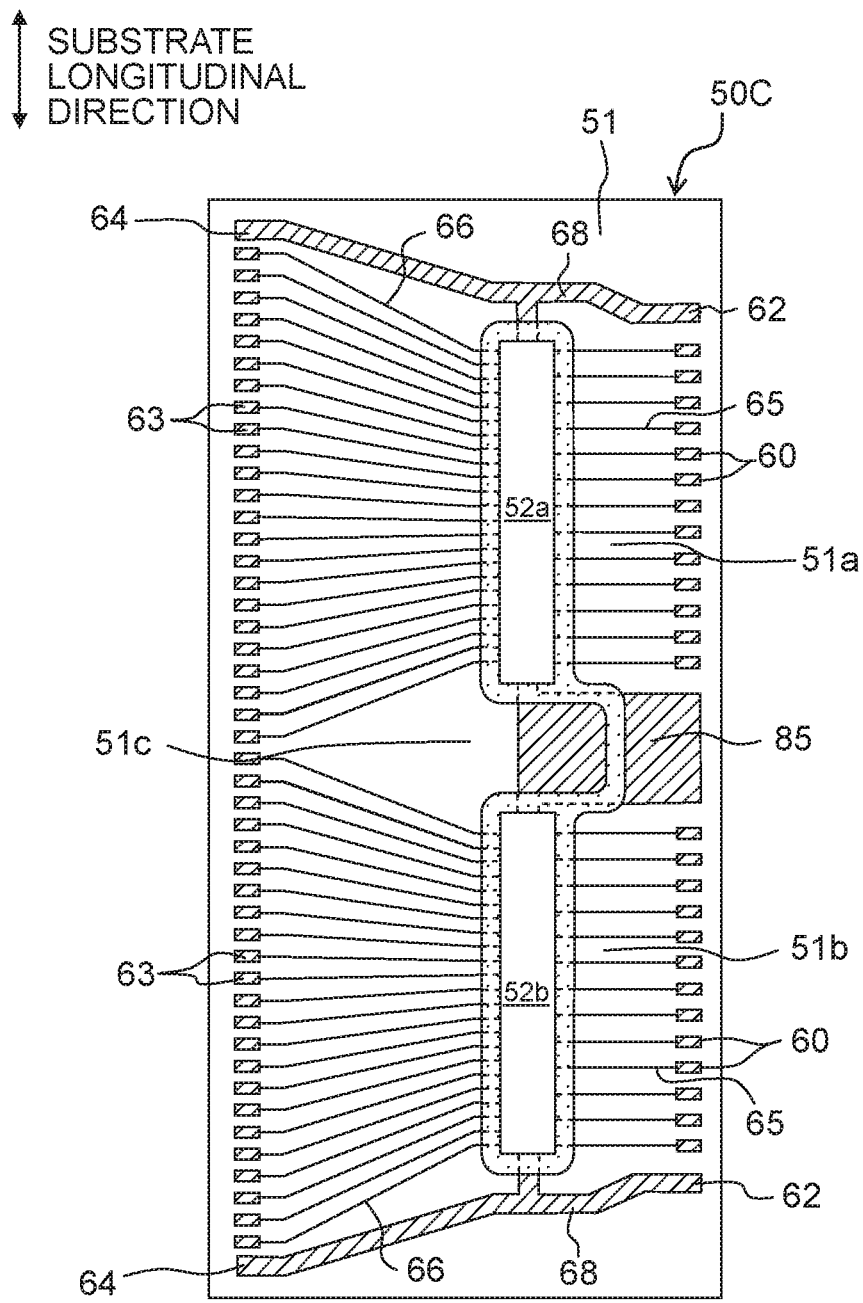
FIG. 10 depicts a back surface of a COF according to a third modified embodiment.

The number of wires forming the conductive part for substrate reinforcement is not particularly limited. For example, like a COF 50C depicted in FIG. 10, a single power wire 85 may function as the conductive part. In that case, the single power wire 85 is preferably thicker than other wires to increase reinforcement effect of the third part 51c. In FIG. 10, the power wire 85 is thicker than the input wires 65, output wires 66, and ground wires 68 arranged in the first part 51a and second part 51b of the flexible substrate 51. In the embodiment of FIG. 10, the ground input terminal 62 corresponds to "a second constant-potential terminal" of the present teaching, and the ground wire 68 corresponds to "a second constant-potential wire" of the present teaching.

Fourth Modified Embodiment

Figure 11:
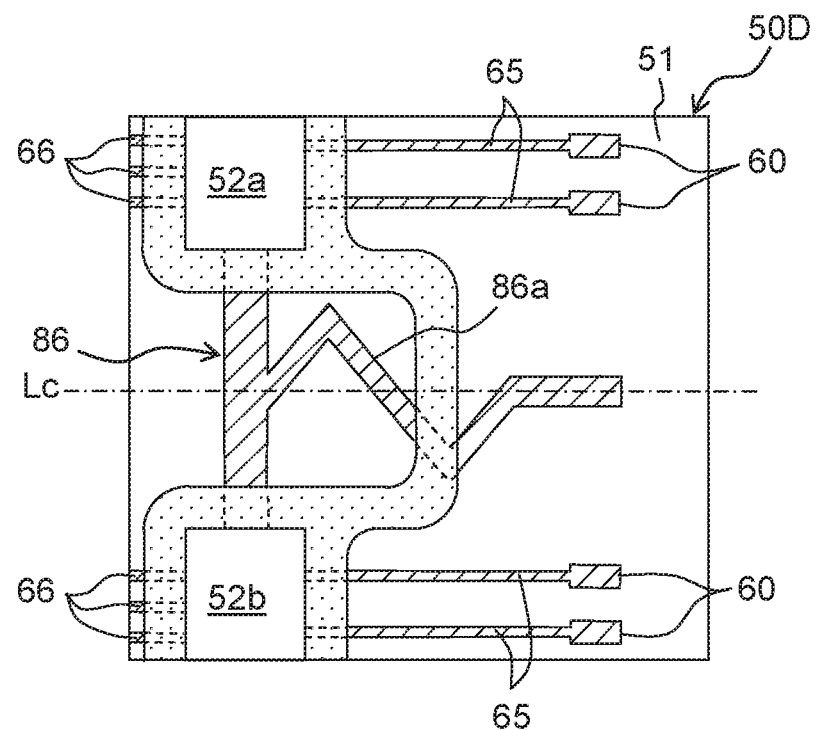
FIG. 11 is a partial enlarged view of a COF according to a fourth modified embodiment.

The conductive part may obliquely intersect with the intermediate line Lc of the two driving ICs in the third part 51c of the flexible substrate 51. For example, in a COF 50D depicted in FIG. 11, a wire 86a of a power wire 86 that is a part of the conductive part extends zigzag while intersecting with the intermediate line Lc of the two driving ICs 52.

Fifth Modified Embodiment

Figure 12:
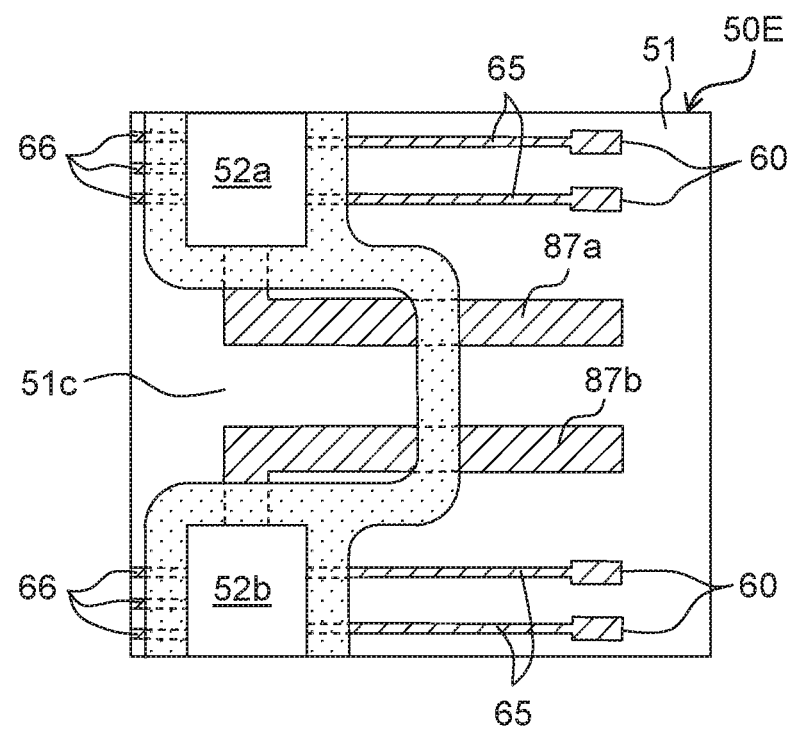
FIG. 12 is a partial enlarged view of a COF according to a fifth modified embodiment.

The conductive part for substrate reinforcement disposed in the third part 51c is not necessarily connected to both of the two driving ICs 52. For example, like a COF 50E depicted in FIG. 12, individual two wires 87a and 87b may be connected to the two driving ICs 52a and 52b, respectively. Or, only the wire 87a (87b) connected to one of the two driving ICs 52 may be disposed in the third part 51c.

Sixth Modified Embodiment

Figure 13A:
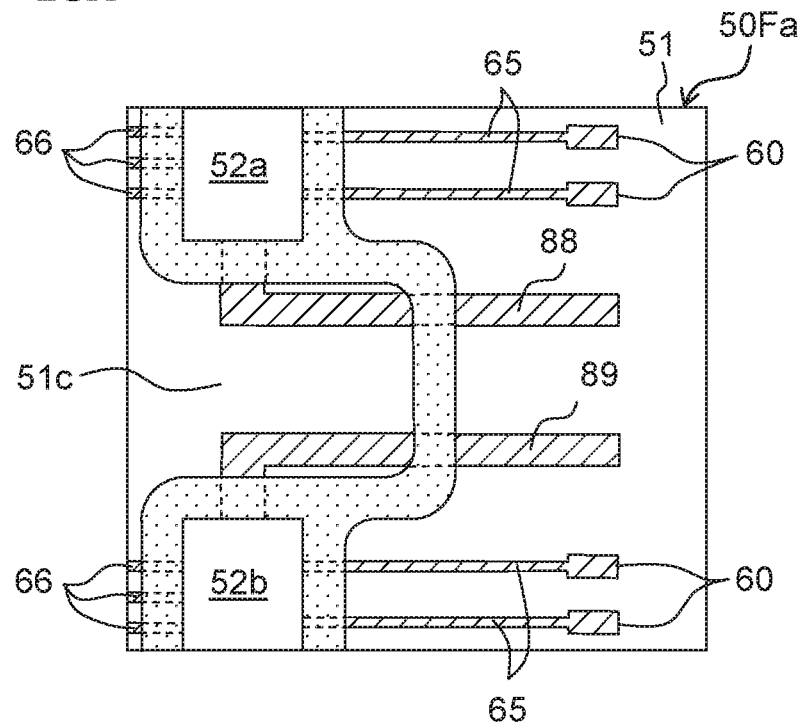
FIGS. 13A and 13B are partial enlarged views of a COF according to a sixth modified embodiment.
Figure 13B:
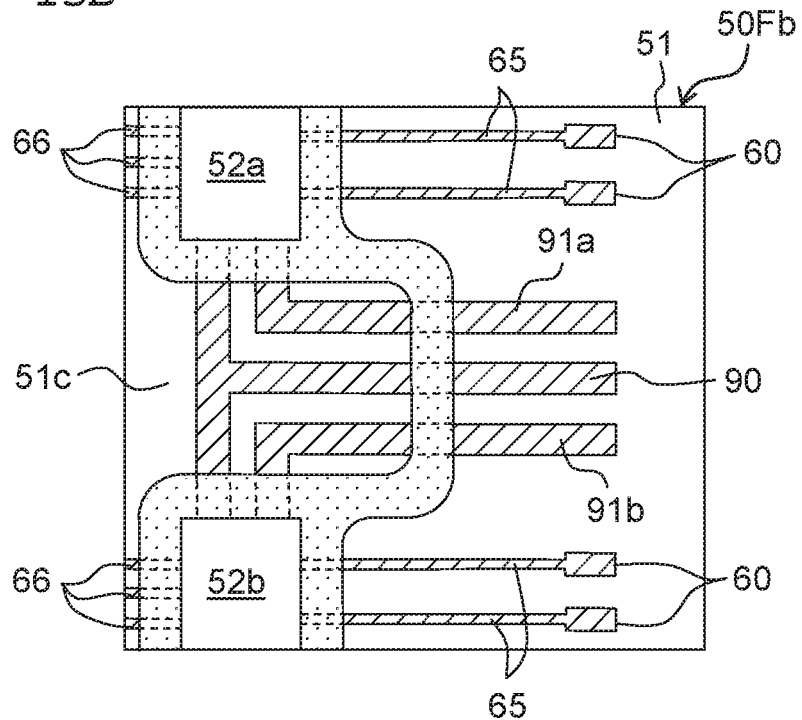

Both of the power wire and the ground wire may be disposed, as the conductive part, in the third part 51c of the flexible substrate 51. For example, in a COF 50Fa depicted in FIG. 13A, a power wire 88 connected to the first driving IC 52a and a ground wire 89 connected to the second driving IC 52b are disposed in the third part 51c of the flexible substrate 51. In a COF 50Fb depicted in FIG. 13B, a power wire 90 connected to both of the two driving ICs 52 and two ground wires 91a, 91b respectively connected to the two driving ICs 52 are disposed in the third part 51c.

Seventh Modified Embodiment

A circuit component may be disposed in the third part 51c of the flexible substrate 51. For example, in COFs 50Ga and 50Gb depicted in FIGS. 14A and 14B, circuit components 92 (e.g., capacitors) are laid across the power wire 90 and ground wires 91a, 91b. Arranging the circuit components 92 in the third part 51c further prevents the third part 51c from bending.

Figure 14A:
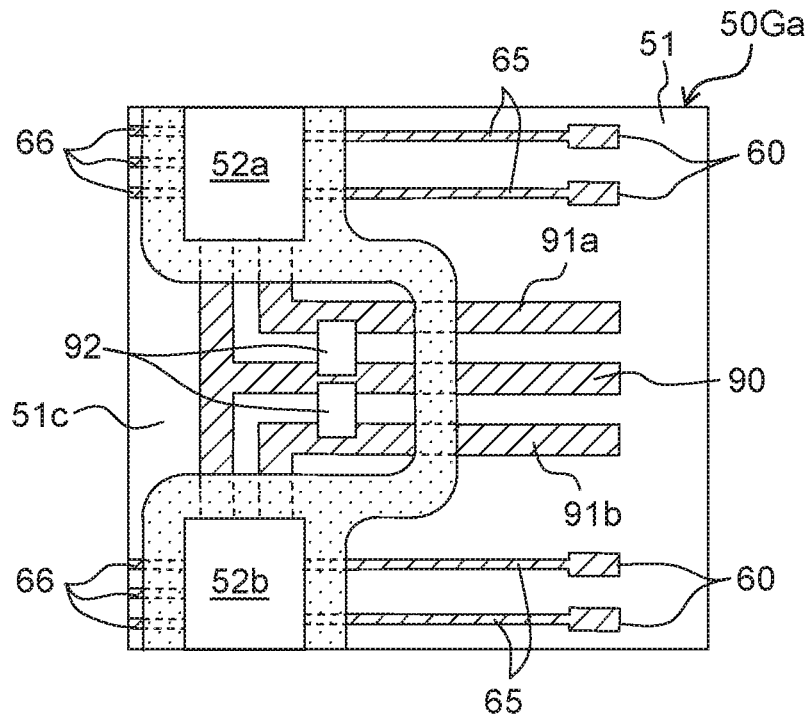
FIGS. 14A and 14B are partial enlarged views of a COF according to a seventh modified embodiment.
Figure 14B:
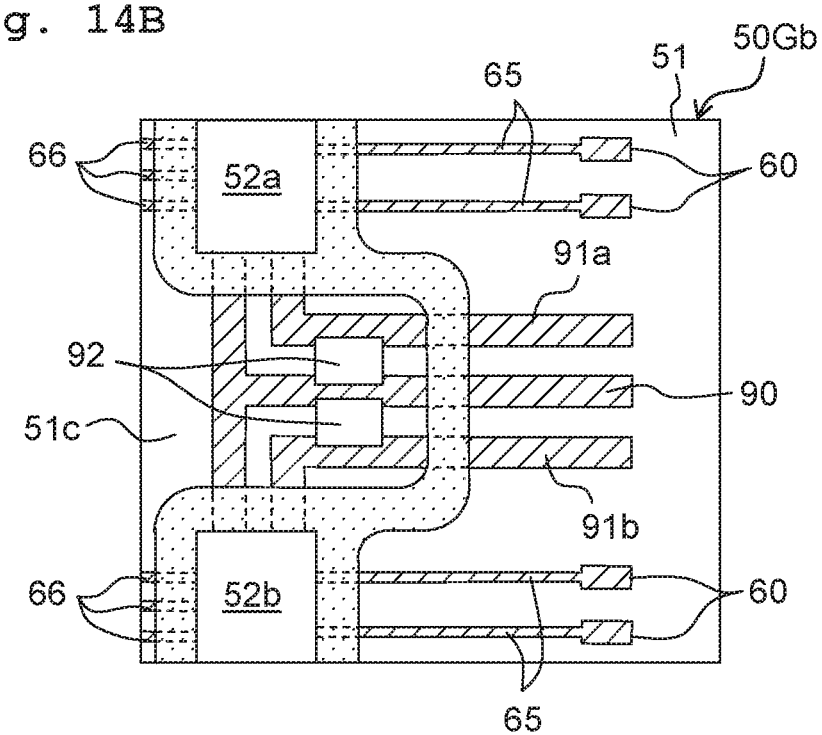

When each of the circuit components 92 has an elongated shape in one direction, like the COF 50Ga depicted in FIG. 14A, the circuit components 92 may be arranged such that a longitudinal direction of the circuit components 92 is parallel to the arrangement direction of the two driving ICs 52. In that case, the circuit components 92 effectively prevent the flexible substrate 51 from bending at a position between the two driving ICs 52. Or, like the COF 50Gb depicted in FIG. 14B, the circuit components 92 may be arranged such that a lateral direction of the circuit components 92 is parallel to the arrangement direction of the two driving ICs 52. In that case, although the bending prevention effect of the flexible substrate 51 at the position between the two driving ICs 52 is smaller than that of the COF 50Ga, excessive great force is not likely to be exerted on the circuit components 92, thus preventing the circuit components 92 from being damaged.

Eighth Modified Embodiment

Figure 15:
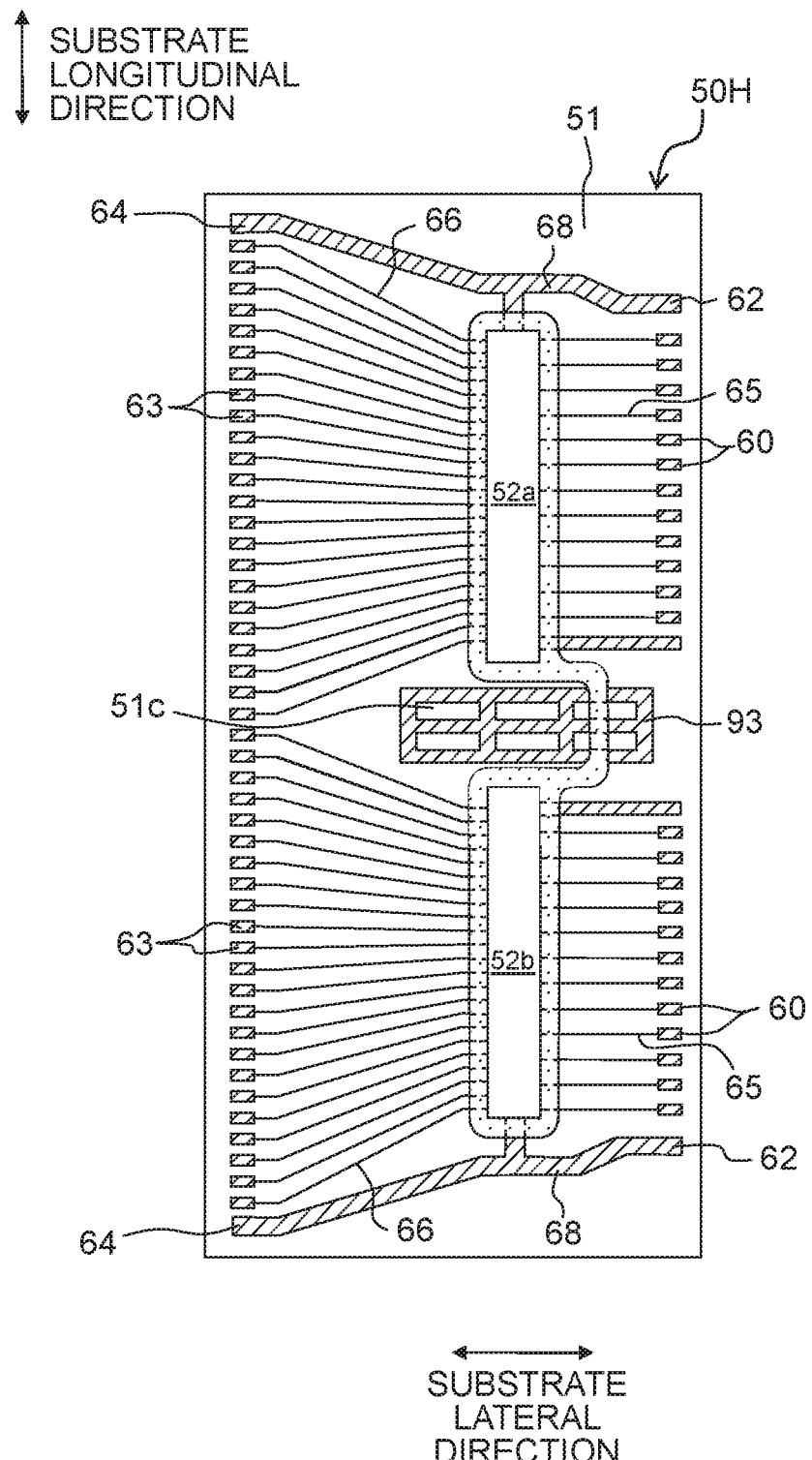
FIG. 15 depicts a back surface of a COF according to an eighth modified embodiment.

The conductive part may be a conductive pattern connected to no driving ICs 52, that is, a dummy conductive pattern. For example, in a COF 50H depicted in FIG. 15, a conductive part 93, which is formed in a grid-like pattern, is disposed in the third part 51c of the flexible substrate 51. The conductive part 93 is a dummy pattern that is connected to no driving ICs 52 and is separated from other wires and terminals of the flexible substrate 51. As depicted in FIG. 15, the conductive part 93 may be disposed at a part of the third part 51c closer to the signal-output side than the two driving ICs 52 (left side in FIG. 15), in addition to a part of the third part 51c between the two driving ICs 52 and a part of the third part 51c closer to the signal-input side than the driving ICs 52 (right side in FIG. 15).

The dummy conductive part is not limited to a pattern connected continuously, such as the pattern depicted in FIG. 15. Namely, dummy conductive parts may be discretely arranged in the third part 51c of the flexible substrate 51 to form independent island shapes.

Ninth Modified Embodiment

Figure 16:
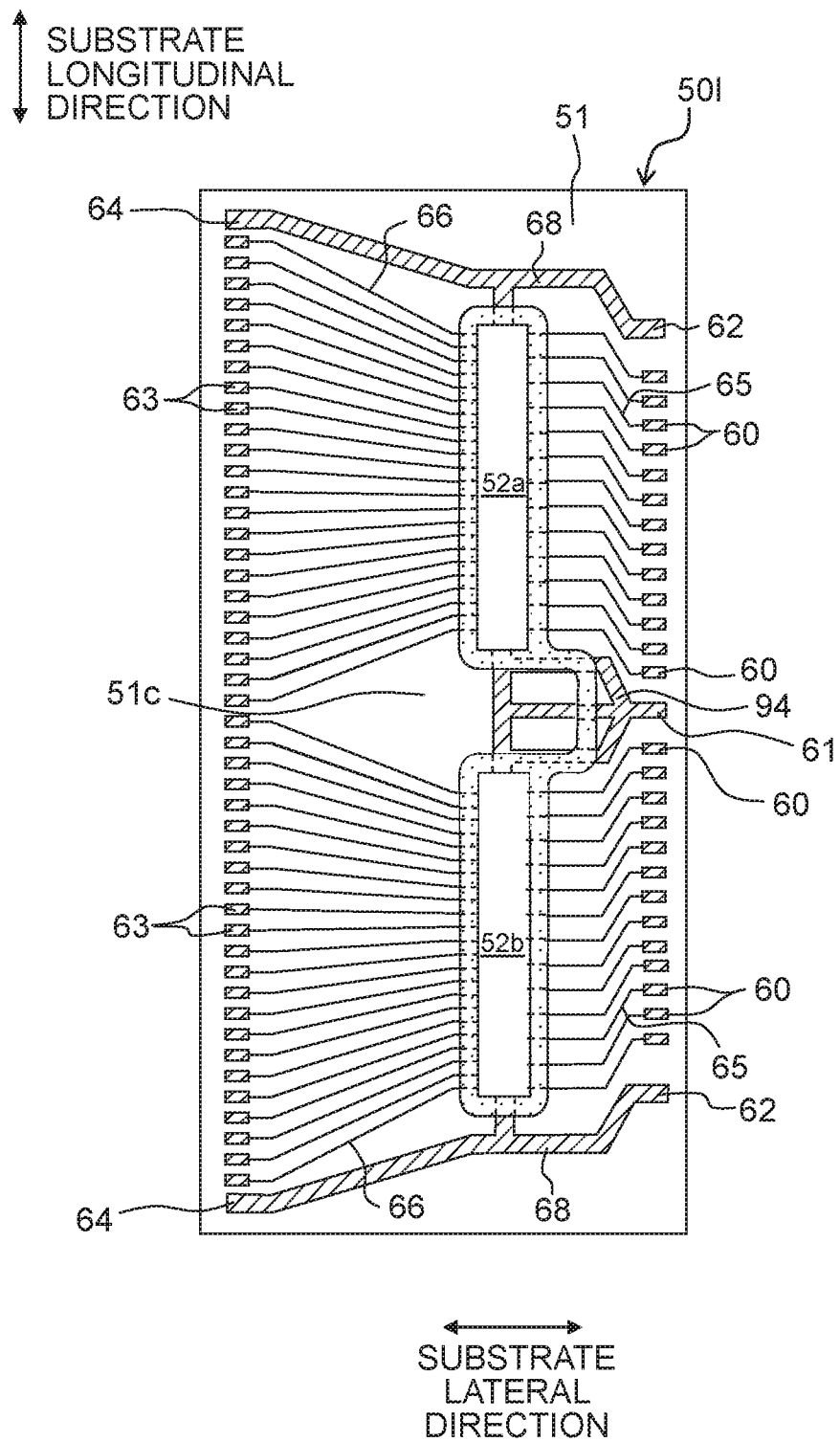
FIG. 16 depicts a back surface of a COF according to a ninth modified embodiment.

As depicted in a COF 50I of FIG. 16, input terminals including the signal input terminals 60, power input terminal 61, and the ground input terminals 62 may be shifted to a center side in the substrate longitudinal direction. More specifically, the signal input terminals 60 are arranged closer to the center side in the substrate longitudinal direction compared to a case in which the input wires 65 are parallel to the substrate lateral direction, by extending the input wires 65 while being inclined to the substrate lateral direction. Accordingly, in FIG. 16, not only the power wire 94 but also some of the signal input terminals 60 and input wires 65 are arranged in the third part 51c of the flexible substrate 51. This configuration enhances the bending prevention effect of the third part 51c.

Tenth Modified Embodiment

Figure 17:
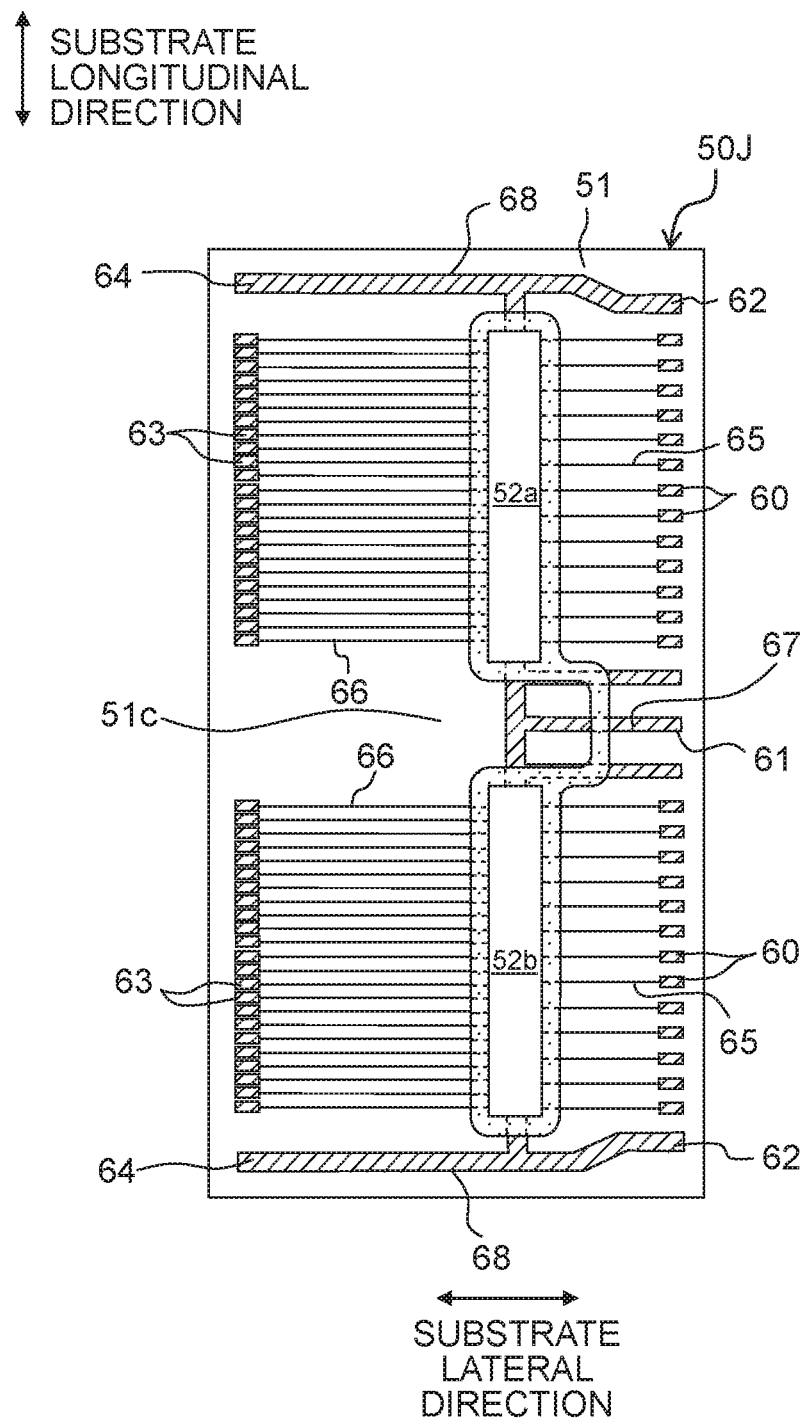
FIG. 17 depicts a back surface of a COF according to a tenth modified embodiment.

As depicted in a COF 50J of FIG. 17, the output wires 66 may extend in parallel with the substrate lateral direction, that is, a direction orthogonal to the arrangement direction of the two driving ICs 52. In such a configuration, since no output wires 66 are arranged in the third part 51c, the third part 51c is more likely to bend than the configuration depicted in FIG. 5. Thus, a conductive part for reinforcement, such as the power wire 67, is preferably disposed in the third part 51c of that configuration.

Although the two driving ICs 52 are provided in the flexible substrate 51 according to the above embodiment, three or more driving ICs 52 may be arranged adjacent to each other.

Although the piezoelectric elements are driven by the drive signal inputted from each COF 50 according to the above embodiment, drive targets to which the drive signal is supplied are not limited to the piezoelectric elements. For example, the drive targets may be heating elements that generate heat when accepting input of the drive signal and apply energy to ink.

In the above description, the present teaching is applied to the ink-jet head that jets ink on the recording sheet to print an image or the like thereon. The present teaching, however, may be applied to a liquid jetting apparatus that is used in various ways of use other than printing of the image or the like. The present teaching may be applied, for example, to a liquid jetting apparatus that jets conductive liquid onto a substrate to form a conductive pattern on a surface of the substrate.

Subsequently, an explanation will be made on a disclosed teaching other than the teaching set forth in the original claims. The disclosed teaching relates to a liquid jetting apparatus including: a head unit provided with: first driving elements and second driving elements arrayed in predefined direction; first contact portions connected to the first driving elements and arranged at a first outside of the first driving elements in the predefined direction; and second contact portions connected to the second driving elements and arranged at a second outside of the second driving elements in the predefined direction; and wire members each having a first part connected to the first contact portions; a second part connected to the second contact portions; and a connection part connecting the first part and the second part.

An embodiment of the above disclosed teaching will be described with reference to FIGS. 18 to 20. Configurations of a channel substrate, piezoelectric elements, and the like according to the disclosed teaching are substantially the same as those of FIGS. 2 to 4. Thus, in the following explanation, the same reference numerals are assigned to components having the same configurations as FIGS. 2 to 4, and description of such components will be appropriately omitted.

Figure 18:
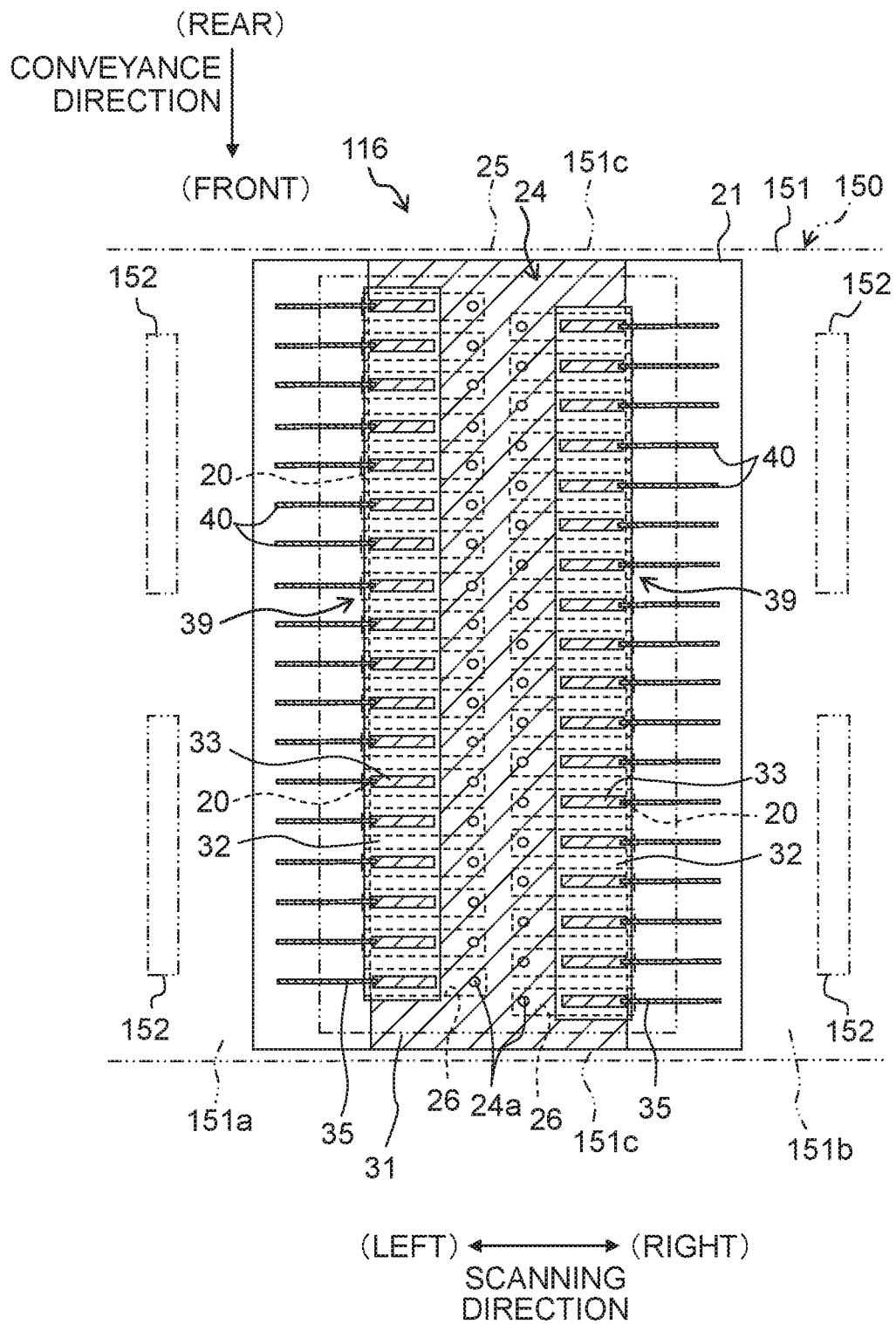
FIG. 18 is a top view of a head unit according to an embodiment of a disclosed teaching.
Figure 19:
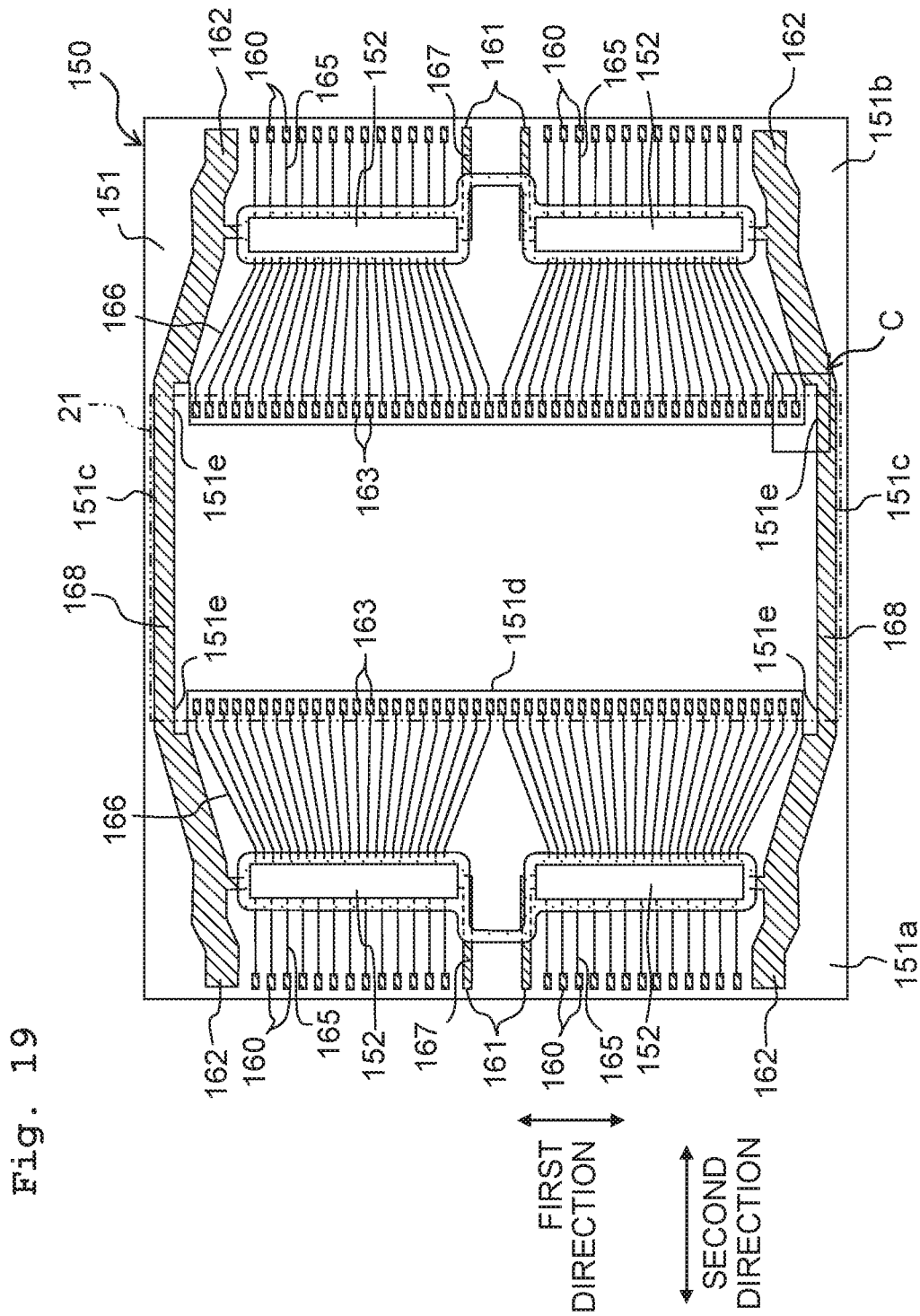
FIG. 19 depicts a back surface of a COF of FIG. 18.
Figure 20:
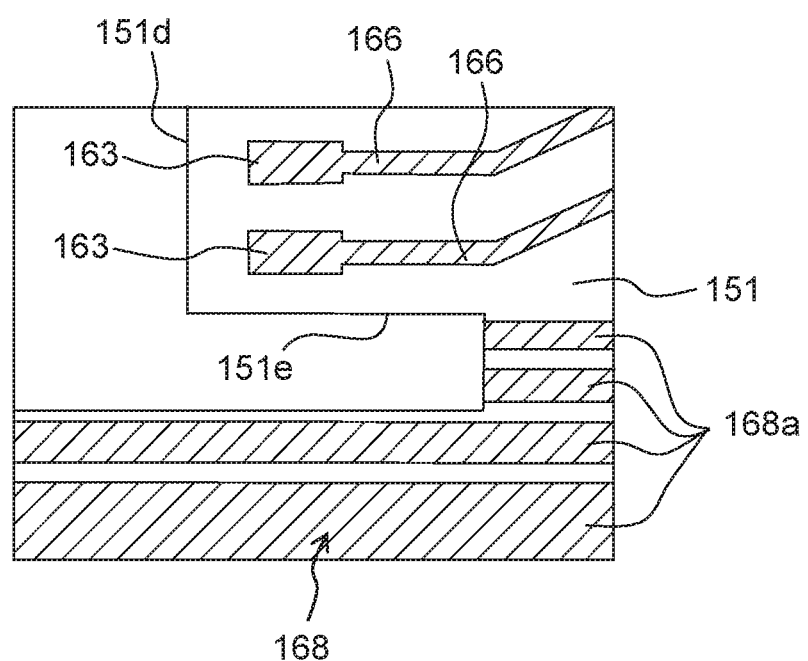
FIG. 20 is an enlarged view depicting a portion C of FIG. 19.

As depicted in FIGS. 18 and 19, a COF 150 according to the present embodiment includes a flexible substrate 151 and four driving ICs 152 mounted on the flexible substrate 151. The flexible substrate 151 includes a first part 151a, a second part 151b, and a connection part 151c connecting the first part 151a and the second part 151b.

The first part 151a is joined to drive contact portions 40 arranged at a left end of a head unit 116 depicted in FIG. 18. The first part 151a is formed with two driving ICs 152 arranged in a first direction in FIG. 19. Signal input terminals 160, power input terminals 161, and ground input terminals 162 are arranged at an outer end of the first part 151a in the second direction. Signal output terminals 163 are arranged at an inner end of the first part 151a in the second direction. Further, input wires 165, output wires 166, and power wires 167 are arranged in the first part 151a.

The second part 151b is joined to drive contact portions 40 arranged at a right end of the head unit 116 of FIG. 18. As with the first part 151a, the second part 151b is formed with two driving ICs 152 arranged in the first direction. Signal input terminals 160, power input terminals 161, and ground input terminals 162 are arranged at outer end of the second part 151b in the second direction. Signal output terminals 163 are arranged at an inner end of the second part 151b in the second direction. Further, input wires 165, output wires 166, and power wires 167 are arranged in the second part 151b.

An opening 151d is formed between the first part 151a and the second part 151b of the COF 150. The two elongated connection parts 151c, which are arranged on both sides of the opening 151d in the first direction, connect the first part 151a and the second part 151b. Ground wires 168, which are formed from an outer end of the first part 151a in the second direction to an outer end of the second part 151b in the second direction through the connection parts 151c, connect the ground input terminals 162 of the first part 151a and the ground input terminals 162 of the second part 151b. Notches 151e extending in the second direction are formed at respective four corners of the opening 151d.

Regarding a configuration in which the drive contact portions 40 of the piezoelectric actuator 24 are arranged separately at left and right sides, such as the configuration depicted in FIG. 2, the two COFs 50 may be joined to a left group of the drive contact portions 40 and a right group of the drive contact portions 40, respectively. In such a configuration, a joining step of the COF 50 including heating and pressing steps is required to be performed twice separately. This may break the piezoelectric actuator 24 having a very small thickness, and thus that configuration is undesirable. In the present embodiment, however, the two connection parts 151c connect the first part 151a and the second part 151b that are joined to the left and right groups of the drive contact portions 40, respectively. Thus, joining between the first part 151a and the drive contact portions 40 and joining between the second part 151b and the drive contact portions 40 may be performed through a single joining step.

The connection between the first part 151a and the second part 151b, however, has the following problem. Namely, when any tensile force is acted from the exterior of the COF 150 during assembly of the head unit 116, the force is exerted on joining portions between the COF 150 and the drive contact portions 40 of the piezoelectric actuator 24, causing the COF 150 to be peeled from the drive contact portions 40 easily. In the present embodiment, however, the notches 151e are formed at respective four corners of the opening 151d of the COF 150, that is, connection portions between the first and second parts 151a, 151b and the connection parts 151c. In such a configuration, even if external force is acted on the COF 150, the force is not likely to be acted on the joining portions between the COF 150 and the drive contact portions 40 of the piezoelectric actuator 24.

In the above configuration, however, the connection parts 151c of the flexible substrate 150 easily bend, because the connection parts 151c connecting the first part 151a and the second part 151b have elongated shapes and the notches 151e are formed at the corners of the opening 151d. Thus, in order to prevent bending of the flexible substrate 150, it is preferable to take a measure to improve rigidity of the connection parts 151c. In this respect, the connection parts 151c of the present embodiment are formed with the ground wires 168 that are different from the input wires 165 and output wires 166. Thus, the ground wires 168 function as conductive parts strengthening the connection parts 151c. Arranging the ground wires 168 in the connection parts 151c improves rigidity of the connection parts 151c, which prevents bending of the connection parts 151c.

The ground wires 168 are preferably thicker than the input wires 165 and output wires 166 to increase the reinforcement effect. However, when the wire thickness and pitch greatly differ between the ground wires 168 and the output wires 166 adjacent thereto, the etching level may differ between the areas formed with the ground wires 168 and the areas formed with the output wires 166. This decrease etching accuracy in a part of the output wires 166 adjacent to the ground wires 168. Thus, as depicted in FIG. 20, the ground wire 168 arranged in the connection part 151c is preferably branched into wires 168a. Further, the wire width or wire pitch of each of the wires 168a is preferably smaller toward the side of output wires 166.

Japanese Patent Application No. 2007-175882 is a related art of the disclosed teaching. A liquid jetting head disclosed in this related art includes piezoelectric elements provided on a channel substrate including pressure chambers, and a wiring member connected to contact portions of the piezoelectric elements. The piezoelectric elements form two piezoelectric element arrays. The contact portions, which are drawn from the piezoelectric elements respectively, are arrayed between the two piezoelectric element arrays to form two contact portion arrays.

The wiring member is formed with two driving ICs corresponding to the two contact portion arrays. An opening is formed between the two driving ICs of the wiring member, and notches are formed at end positions of the opening. The notches allow two parts positioned between the opening and the two driving ICs to bend inside. The two parts are provided with connection terminals that are connected to the channel substrate in a state where the two parts are bent inside.

In the configuration described in that related art, however, contact portions drawn from the piezoelectric elements are arranged densely between the two piezoelectric elements of the channel substrate. Thus, in order to join the two parts of the wiring member to the channel substrate while bending the two parts, an area between the two piezoelectric element arrays is required to have a certain width or longer. This increases a distance between two pressure chamber arrays corresponding to the two piezoelectric element arrays, resulting in a great distance between two adjacent nozzle arrays.

In this respect, the drive contact portions of the two piezoelectric element arrays according to the present embodiment are drawn from the piezoelectric elements 39 to left and right sides, respectively. That is, the first part 151a and the second part 151b of the COF 150 are joined to outside areas of the two piezoelectric element arrays, respectively. This eliminates the need of increasing the distance between the two pressure chamber arrays corresponding to the two piezoelectric element arrays, thus making it possible to reduce the distance between two adjacent nozzle arrays.

What is claimed is:

1. A head, comprising:
    a head unit including a first piezoelectric element, a second piezoelectric element, a first contact portion connected to the first piezoelectric element, and a second contact portion connected to the second piezoelectric element; and
    a wiring film including a flexible substrate, a first IC, a second IC, a first wire connecting the first IC and the first contact portion, a second wire connecting the second IC and the second contact portion, and a third wire formed in an area of the flexible substrate between the first IC and the second IC, the third wire connecting the first IC and the second IC.

2. The head according to claim 1,
    wherein the head unit further includes a vibration film, and
    each of the first piezoelectric element and the second piezoelectric element includes a common electrode, a piezoelectric layer, and an individual electrode stacked on the vibration film in this order.

3. The head according to claim 2, wherein the head unit further includes: a first individual wire on the vibration film, the first individual wire connecting the individual electrode of the first piezoelectric element and the first contact portion; and a second individual wire on the vibration film, the second individual wire connecting the individual electrode of the second piezoelectric element and the second contact portion.

4. The head according to claim 2,
    wherein the common electrode of the first piezoelectric element and the common electrode of the second piezoelectric element are integrated as a single common electrode layer, and
    the head unit further includes: a third contact portion; and a common wire on the vibration film, the common wire connecting the single common electrode layer and the third contact portion.

5. The head according to claim 1, wherein the head unit further includes a channel substrate made from silicon and having channels therein.

6. The head according to claim 1, wherein the first wire, the second wire, and the third wire are the same material.

7. The head according to claim 1,
    wherein the wiring film includes a first constant-potential terminal to which a constant potential is to be applied and a first constant-potential wire connecting the first constant-potential terminal and at least one of the first IC and the second IC, and
    a part, of the first constant-potential wire, in the area of the flexible substrate is the third wire.

8. The head according to claim 7, wherein the first constant-potential terminal is a terminal to which a ground potential is to be supplied.

9. The head according to claim 7, wherein the first constant-potential terminal is a terminal to which a drive potential driving the first piezoelectric element and the second piezoelectric element is to be supplied.

10. The head according to claim 7,
    wherein the first constant-potential wire includes a connection part connected to the first IC and to the second IC,
    the connection part extends from the first IC to the second IC across the area of the flexible substrate, and
    the connection part is the third wire.

11. The head according to claim 7, wherein the wiring film further includes:
    a second constant-potential terminal to which the constant potential is to be applied; and a second constant-potential wire on an opposite side of the area of the flexible substrate with respect to the first IC or the second IC, the second constant-potential wire connecting the second constant-potential terminal and the first IC or the second IC.

12. The head according to claim 11, wherein the first constant-potential wire configuring the third wire has a width greater than a width of the second constant-potential wire.

13. The head according to claim 11, wherein, in the area of the flexible substrate, the first constant-potential wire extends in a direction intersecting with an intermediate line between the first IC and the second IC.

14. The head according to claim 11, wherein, in the area of the flexible substrate, the first constant-potential wire includes wires arranged at intervals in an arrangement direction of the first IC and the second IC.

15. The head according to claim 1, wherein the third wire is at a position not overlapping with the first wire and the second wire.

16. The head according to claim 1, wherein a joining portion between the first IC and the flexible substrate and a joining portion between the second IC and the flexible substrate are sealed with a sealing material different from the third wire.

17. The head according to claim 16, wherein the sealing material is in the area of the flexible substrate.

18. The head according to claim 1, wherein a circuit component is in the area of the flexible substrate.

19. The head according to claim 1,
wherein the wiring film includes input terminals arrayed in the flexible substrate in an arrangement direction of the first IC and the second IC, and
the input terminals are on a center side of the flexible substrate in the arrangement direction.

* * * * *

UNITED STATES PATENT AND TRADEMARK OFFICE
CERTIFICATE OF CORRECTION

PATENT NO. : 10,618,277 B2
APPLICATION NO. : 16/229386
DATED : April 14, 2020
INVENTOR(S) : Toru Yamashita Page 1 of 1

It is certified that error appears in the above-identified patent and that said Letters Patent is hereby corrected as shown below:

In the Claims

Column 16, Claim 1, Line 12:
Please delete "wire formed in an area" and insert --wire in an area--

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*